(12) United States Patent
Yamaguchi

(10) Patent No.: US 8,319,536 B2
(45) Date of Patent: Nov. 27, 2012

(54) INTEGRATED CIRCUIT DEVICE, ELECTRONIC EQUIPMENT AND CONTROL METHOD

(75) Inventor: Masayuki Yamaguchi, Chino (JP)

(73) Assignee: Seiko Epson Corporation (JP)

( * ) Notice: Subject to any disclaimer, the term of this patent is extended or adjusted under 35 U.S.C. 154(b) by 99 days.

(21) Appl. No.: 12/940,559

(22) Filed: Nov. 5, 2010

(65) Prior Publication Data

US 2011/0133802 A1    Jun. 9, 2011

(30) Foreign Application Priority Data

Dec. 8, 2009   (JP) ................................. 2009-278552

(51) Int. Cl.
*H03K 3/84* (2006.01)

(52) U.S. Cl. ......... 327/164; 327/168; 327/172; 327/175
(58) Field of Classification Search .................. 327/164, 327/172, 175, 178, 291
See application file for complete search history.

(56) References Cited

U.S. PATENT DOCUMENTS

2009/0058483 A1* 3/2009 Shin et al. ..................... 327/175

FOREIGN PATENT DOCUMENTS

JP         8-44449         2/1996

* cited by examiner

*Primary Examiner* — Lincoln Donovan
*Assistant Examiner* — John Poos
(74) *Attorney, Agent, or Firm* — Harness, Dickey & Pierce, P.L.C.

(57) ABSTRACT

An integrated circuit device includes a first rectangular wave signal generation section that outputs a first rectangular wave signal when an amplitude of an oscillation signal inputted is greater than a first amplitude, and a second rectangular wave signal generation section that outputs a second rectangular wave signal when the amplitude of the oscillation signal is greater than a second amplitude that is greater than the first amplitude, and that controls the power supply voltage of an oscillation circuit by the first and second rectangular wave signals so as to maintain an appropriate potential difference with respect to a stop voltage against changes in the oscillation stop voltage associated with changes in a temperature condition.

10 Claims, 19 Drawing Sheets

| | Output 403 from Third rectangular wave signal generation section or its frequency-divided wave 430B | |
|---|---|---|
| Output 402 from Second rectangular wave signal generation section or its frequency-divided wave 430A | Fixed value | Rectangular wave |
| Fixed value | Elevate VREG 404 | Maintain current VREG 404 |
| Rectangular wave | Not Applicable | Lower VREG 404 |

INTEGRATED CIRCUIT DEVICE, ELECTRONIC EQUIPMENT AND CONTROL METHOD

The entire disclosure of Japanese Patent Application No. 2009-278552, filed Dec. 8, 2009 is expressly incorporated by reference herein.

TECHNICAL FIELD

The present invention relates to integrated circuit devices, electronic equipment and methods for controlling regulated voltages.

BACKGROUND OF TECHNOLOGY

In integrated circuit devices that are used in watches, real-time clocks and the like, there are cases where their oscillation circuits and logic circuits may use, for controlling power consumption, regulated voltages that are obtained through stepping down an external power supply supplied from outside of the integrated circuit device by using a regulator. In order to suppress the power consumption as much as possible, the closer the regulated voltage supplied from the regulator to a stop voltage of the integrated circuit device, the better. Here, the stop voltage means a voltage reached as the adjusted voltage is lowered with which the integrated circuit device does not operate. When the regulated voltage reaches the stop voltage, the system clock from the oscillation circuit is not outputted as a rectangular wave sufficient to operate a logic circuit in the succeeding stage, by which the function of the integrated circuit device stops.

For example, in an integrated circuit device for a real time clock, a voltage reduction by 10 mV is effective in reducing the power consumption of about 1 nW. Since the overall power consumption of such an integrated circuit device is about 30 nW, the reduction of 1 nW has a great significance. In this respect, methods for stably maintaining the regulated voltage to a low voltage have been proposed.

For example, as a constant voltage circuit to be used for a regulator, a circuit described in Japanese Laid-open Patent Application HEI 8-44449 is known. A low voltage circuit in accordance with the invention of Japanese Laid-open Patent Application HEI 8-44449 outputs an appropriate regulated voltage by suitably selecting the ratio between a resistor R1 and a resistor R2.

However, the stop voltage has temperature dependency, and the stop voltage generally becomes lower with higher temperatures in a CMOS circuit design. This is caused by the threshold voltage $V_T$ of the CMOS transistor that lowers with higher temperatures. From the viewpoint of lowering power consumption, it is preferred that the regulated voltage outputted from the regulator has the same temperature gradient as that of the stop voltage so as to maintain a constant potential difference with respect to the stop voltage at any temperatures. Therefore, among integrated circuit devices that require low power consumption, there are those that are capable of adjusting the regulated voltage to match with the operation temperature of the stop voltage in an output stage or the like of the constant voltage circuit.

A circuit described in FIG. 18 is an example of an internal circuit of a regulator for making adjustments according to changes in the temperature. A potential difference corresponding to a threshold voltage $V_{TP}$ of a P-type transistor is gained by a diode-connected transistor 900, and a potential difference corresponding to a threshold voltage $V_{TN}$ of an N-type transistor is gained by a transistor 901, such that $V_{OUT}$ correlated with $V_{TP}+V_{TN}$ is outputted. By changing the regulated voltage based on the output $V_{OUT}$, the regulated voltage can be lowered when the temperature rises.

However, the circuit shown in FIG. 18 makes the adjustment in an output stage of the regulator irrespective of the state of the rectangular wave that is outputted from the oscillation circuit. In other words, without judging the state of the actual rectangular wave outputted from the oscillation circuit, the regulated voltage is changed by the circuit shown in FIG. 18 having a structure different from that of the circuit for generating the rectangular wave. For this reason, in effect, a difference is generated in the temperature gradient with respect to that of the stop voltage.

In this case, as shown in FIG. 19, a temperature gradient 1020 of the stop voltage is different in inclination from a temperature gradient 1010 of the regulated voltage provided from the regulator circuit. Accordingly, only a regulated voltage with a sufficient margin from the stop voltage (for example, 70° C.) can be set so that the regulated voltage would not reach the stop voltage across the entire range of rated operation temperatures. In the example of FIG. 19, even in the case of operation in an environment normally at about 40° C., a large margin 1040 needs to be set, considering that it becomes close to the stop voltage at high temperatures (for example, at 70° C.).

Furthermore, the temperature gradient 1020 of the stop voltage and the temperature gradient 1010 of the regulated voltage indicated by solid lines show the characteristic in one condition (for example, a TYP condition) as in the process. In consideration of variations in the process at the time of manufacturing in addition to the above, for example, in FIG. 19, the temperature gradient 1020 of the stop voltage changes in the range between an upper limit 1020A and a lower limit 1020B. Similarly, the temperature gradient 1010 of the regulated voltage may be in the range between an upper limit 1010A and a lower limit 1010B. Therefore, in order for mass-produced products to continue operating at rated operation temperatures, the regulated voltage must be adjusted in consideration of the potential difference between the lower limit of the regulated voltage and the upper limit of the stop voltage (for example, a potential difference 1030).

In other words, when the temperature gradient 1020 of the stop voltage and the temperature gradient 1010 of the regulated voltage are different from each other in their inclination, the margin needs to be decided based on an assumption of a temperature condition in which the potential difference between the temperature gradient 1020 of the stop voltage and the temperature gradient 1010 of the regulated voltage is the narrowest, and further in consideration of variations in the process. For this reason, a large potential difference from the stop voltage would be generated, which makes it difficult to achieve lower power consumption.

The present invention has been made in view of the above-described problems. In accordance with some embodiments of the invention, an integrated circuit device or the like that realizes low power consumption through approximating the temperature gradient of the regulated voltage to the temperature gradient of the stop voltage, to maintain an appropriate potential difference thereof with respect to the stop voltage even when the temperature condition changes.

SUMMARY (1) The present invention relates to an integrated circuit device that includes a first rectangular wave signal generation section that outputs a first rectangular wave signal when an amplitude of an oscillation signal inputted is greater, compared with a first amplitude, and a second rectangular wave signal generation section that outputs a second rectangular wave signal when the amplitude of the oscillation signal is greater, compared with a second amplitude that is greater than the first amplitude.

According to the present invention, if the circuit structure or the like of the second rectangular wave signal generation section is made to be the same as that of the first rectangular wave signal generation section, the inputted oscillation signal is commonly used, such that the second rectangular wave signal has a property (for example, the period) similar to that of the first rectangular wave signal. Accordingly, it is possible to grasp the property and the state of the first rectangular wave signal indirectly from the second rectangular wave signal.

For example, when the first rectangular wave signal is a clock signal of a system that includes the integrated circuit device, and when the first rectangular wave signal is taken in a test circuit or the like to grasp the state thereof, such as, the amplitude and the like, there is the danger that its waveform may be adversely influenced. Even when the waveform is not adversely influenced, the above-described test circuit needs to handle the clock signal as data, which might complicate the circuit design. In such a case, if the state of the first rectangular wave signal can be indirectly grasped through observing the second rectangular wave signal, deterioration of the clock signal and complication of the design would not occur.

Here, the second rectangular wave signal generation section in accordance with the present invention outputs the second rectangular wave signal, when the amplitude of the oscillation signal is greater, compared with the second amplitude that is greater than the first amplitude. Therefore, when the second rectangular wave signal is being generated, it can be judged that the first rectangular wave signal is operating with a margin for lowering the regulated voltage.

(2) The integrated circuit device may include an inversion amplifier that outputs the oscillation signal, a control section that outputs a control signal, and a power supply section that supplies a regulated voltage at least to the inversion amplifier, wherein the control section may output the control signal that instructs to lower the regulated voltage when the second rectangular wave signal is being outputted, and the power supply section may lower the regulated voltage upon receiving the control signal instructing to lower the regulated voltage.

In accordance with the present invention, an oscillation signal is outputted from the inversion amplifier that is a part of an oscillation circuit section. Further, the regulated voltage that is supplied to the inversion amplifier is supplied by the power supply section. The control section outputs a control signal that instructs to lower the regulated voltage to the power supply section, when the second rectangular wave signal is being outputted. Then, as the regulated voltage lowers, the amplitude of the oscillation signal becomes smaller, and when the regulated voltage lowers to a level included in an appropriate voltage range, the second rectangular wave signal is made not to be outputted. By this series of operations, the power consumption of the integrated circuit device can be made smaller.

(3) In the integrated circuit device, the control section may output the control signal that instructs to elevate the regulated voltage at a given timing, and the power supply section may elevate the regulated voltage, upon receiving the control signal instructing to elevate the regulated voltage.

In accordance with the present invention, the control section outputs a control signal that instructs to elevate the regulated voltage, for example, at a periodical timing, a timing at which a specified event occurs, a timing based on a change in temperature detected by a temperature sensor, and the like. Therefore, it is possible to prevent the function of the integrated circuit device from stopping as a result of the regulated voltage being lowered to the stop voltage due to changes in the environment.

(4) The integrated circuit device may include a third rectangular wave signal generation section that outputs a third rectangular wave signal based on the oscillation signal, when the amplitude of the oscillation signal is greater, compared with a third oscillation that is greater than the first oscillation but smaller than the second oscillation; and the control section may output the control signal instructing to elevate the regulated voltage when neither the second rectangular wave signal nor the third rectangular wave signal is being outputted, and the power supply section may elevate the regulated voltage upon receiving the control signal instructing to elevate the regulated voltage.

According to the present invention, when the second rectangular wave signal and the third rectangular wave signal are not outputted, it is possible to judge that the regulated voltage being supplied to the inversion amplifier is coming closer to the stop voltage. At this time, the control section outputs a control signal instructing to elevate the regulated voltage, such that the regulated voltage can be maintained at an appropriate voltage value.

(5) In the integrated circuit device, the control section may output the control signal that instructs to reduce or elevate the regulated voltage at a given timing.

According to the invention, the control section can make judgment and can output the control signal, for example, at a periodical timing, a timing at which a specified event occurs, a timing based on a change in temperature detected by a temperature sensor, and the like. When temperature changes take place sufficiently gently, the power consumption by the control section can be suppressed by performing the judgment at appropriate intervals. It is noted that, when it is judged that it is not necessary to instruct to change the regulated voltage, the state of the control signal may be maintained.

(6) In the integrated circuit device, the second rectangular wave signal generation section or the third rectangular wave signal generation section may stop at least one of outputs of the second rectangular wave signal and the third rectangular wave signal at a given timing.

According to the present invention, the control section can stop at least one of outputs of the second rectangular wave signal and the third rectangular wave signal, for example, when the judgment is not conducted. By this, the power consumption can be further suppressed.

(7) In the integrated circuit device, at least one of the second rectangular wave signal generation section and the third rectangular wave signal generation section may be such that its transistor composing the rectangular wave signal generation section has at least one of a gate width and a gate length that may be different from that of a transistor of the first rectangular wave signal generation section.

According to the present invention, to make a threshold voltage of the transistor in the second rectangular wave signal generation section or the third rectangular wave signal generation section to have a value different from that of the transistor of the first rectangular wave signal generation section, at least one of the gate width and the gate length of the transistor is adjusted. Such adjustment can be readily made at the time of designing.

(8) In the integrated circuit device, at least one of the second rectangular wave signal generation section and the third rectangular wave signal generation section may be such that its transistor composing the rectangular wave signal generation section has a threshold voltage different from that of a transistor of the first rectangular wave signal generation section.

According to the present invention, the threshold voltage of a transistor in the second rectangular wave signal generation section or the third rectangular wave signal generation section is made to have a value different from that of a transistor of the first rectangular wave signal generation section by, for example, ion injection at the time of manufacturing. Even for a portion of transistors having the same gate width and gate length at the time of designing, their threshold voltage can be adjusted at the time of manufacturing. Changes in the manufacturing process can be readily accommodated, and adjustments after designing are possible.

(9) In the integrated circuit device, the second rectangular wave signal generation section may be such that its transistor composing the rectangular wave signal generation section has a threshold voltage that may be different from that of a transistor of the first rectangular wave signal generation section, and the third rectangular wave signal generation section may be such that its transistor composing the rectangular wave signal generation section has at least one of a gate width and a gate length that may be different from that of a transistor of the first rectangular wave signal generation section.

According to the present invention, as for the third rectangular wave signal indicating a margin to the stop voltage, if there is a low probability of changing after prototype designing, at least one of the gate width and the gate length is made to be different from that of a transistor of the first rectangular wave signal generation section at the time of the designing. On the other hand, as for the second rectangular wave signal indicating the upper limit of the regulated voltage, if there is a high probability of being adjusted after prototype designing in order to lower the power consumption, the threshold voltage of the transistor is made adjustable at the time of manufacturing or the like. By this, integrated circuit devices with a margin for further lowering the power consumption after designing can be provided.

(10) The present invention pertains to electronic equipment including the integrated circuit device.

According to the present invention, the electronic equipment with lower power consumption can be provided.

(11) The present invention relates to a method for controlling an integrated circuit device, including a control signal outputting step of outputting a control signal, a regulated voltage supplying step of supplying a regulated voltage, a step of outputting an oscillation signal, a step of outputting a first rectangular wave signal when an amplitude of the oscillation signal inputted is greater compared with a first amplitude, and a step of outputting a second rectangular wave signal when the amplitude of the oscillation signal is greater compared with a second amplitude greater than the first amplitude, wherein, in the control signal outputting step, the control signal that instructs to lower the regulated voltage is outputted when the second rectangular wave signal is being outputted; and in the regulated voltage supplying step, the regulated voltage is lowered upon receiving the control signal instructing to lower the regulated voltage.

According to the invention, in the method for controlling an integrated circuit device, a control signal that instructs to lower the regulated voltage is outputted when the second rectangular wave signal is being outputted, thereby controlling at least the regulated voltage based on the control signal. Accordingly, the regulated voltage can be lowered to an appropriate voltage such that the power consumption of the integrated circuit device can be made smaller.

BRIEF DESCRIPTION OF THE DRAWINGS

FIG. 4(A) is a waveform diagram of a first rectangular wave signal and the like. FIG. 4(B) is a waveform diagram of a second rectangular wave signal and the like.

FIG. 10 is a waveform diagram of a third rectangular wave signal and the like.

FIG. 13 is a table showing judgments by the control section in accordance with the third embodiment.

DETAILED DESCRIPTION

Hereinbelow, embodiments of the invention will be described with reference to the drawings. It is noted that, in the description of a second embodiment and thereafter, compositions thereof similar to those of the first embodiment are appended with the same reference numbers and their description will be omitted.

1. First Embodiment

A first embodiment of the present invention will be described with reference to FIG. 1.

Figure 1:
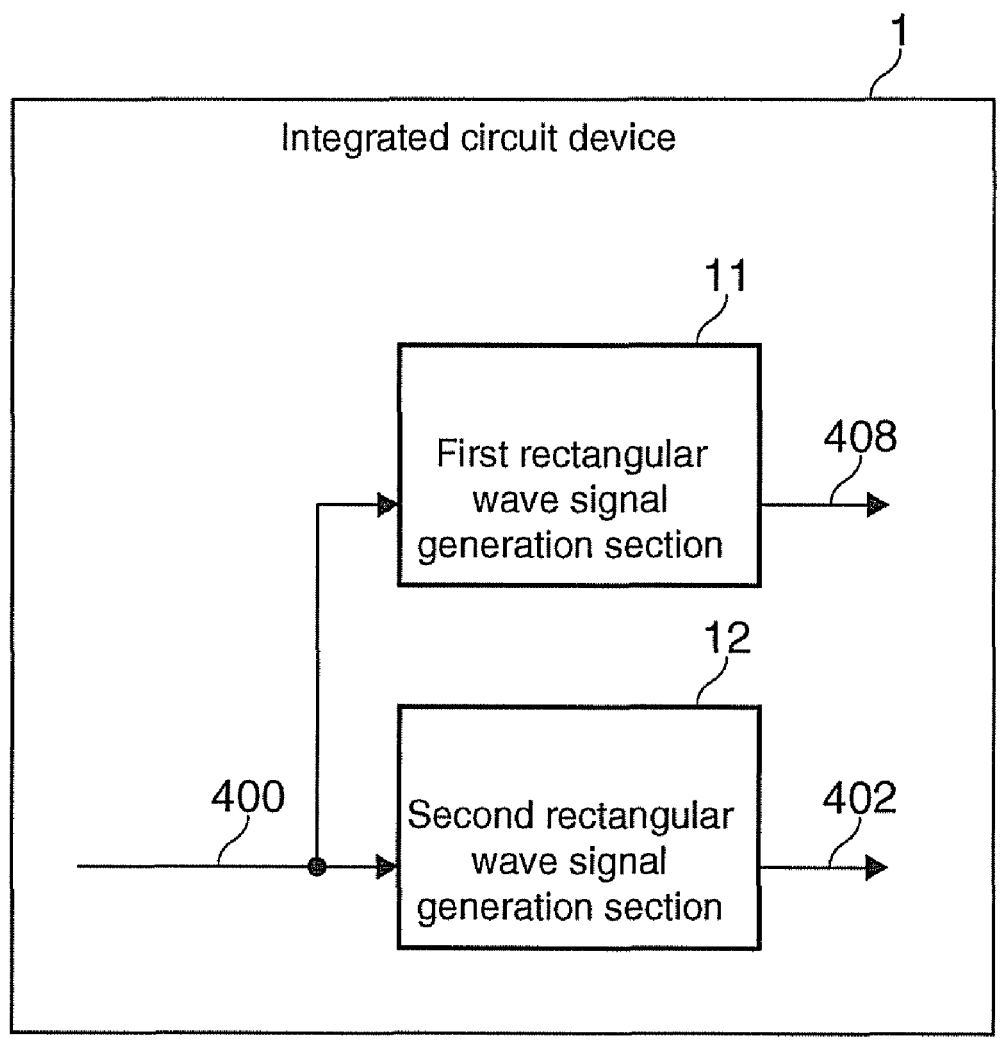
FIG. 1 is a block diagram of an integrated circuit device in accordance with a first embodiment.

FIG. 1 is a block diagram of an integrated circuit device 1 in accordance with the present embodiment. The integrated circuit device 1 includes a first rectangular wave signal generation section 11 and a second rectangular wave signal generation section 12. The first rectangular wave signal generation section 11 receives an oscillation signal 400, and outputs a first rectangular wave signal 408 when the oscillation signal 400 has an amplitude greater than a predetermined first amplitude. The second rectangular wave signal generation section 12 receives the oscillation signal 400, and outputs a second rectangular wave signal 402 when the oscillation signal 400 has an amplitude greater than a predetermined second amplitude.

Figure 18:
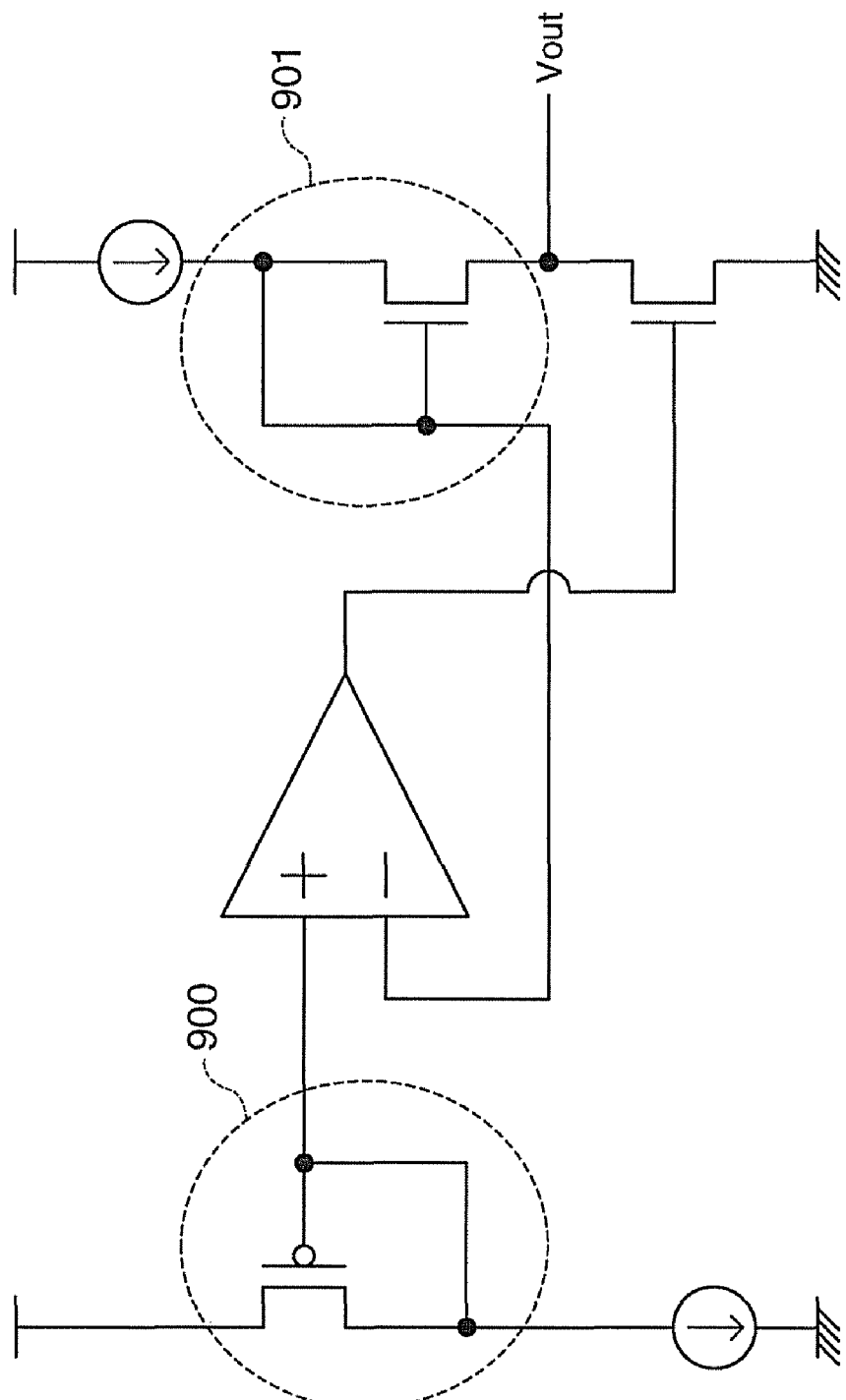
FIG. 18 is a chart showing a prior art circuit structure example for generating a regulated voltage in a power supply section.
Figure 19:
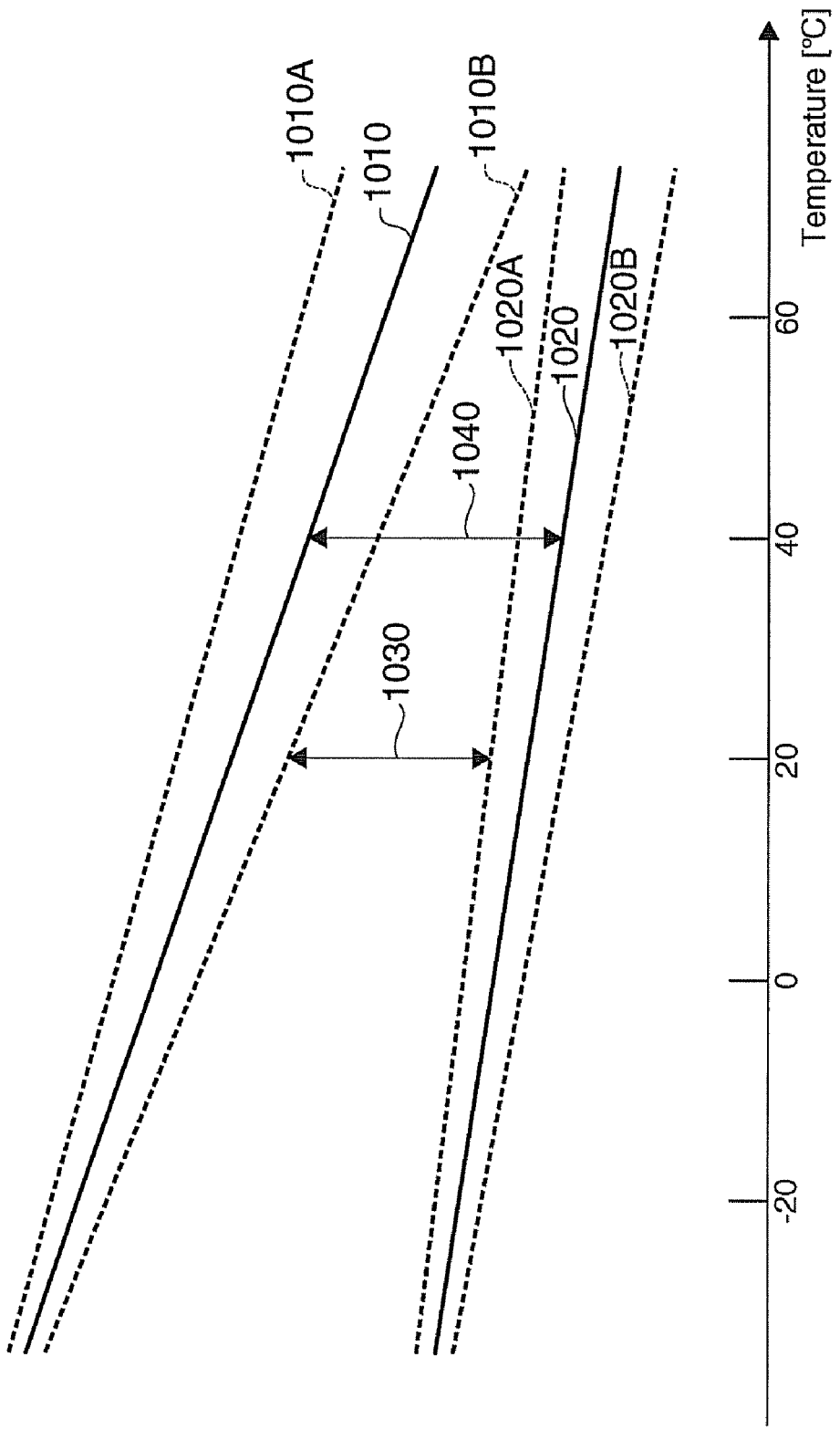
FIG. 19 is a graph showing a summary of changes in the regulated voltage and the stop voltage in the prior art circuit structure.

The first rectangular wave signal generation section 11 outputs the first rectangular wave signal 408 as, for example, a system clock that is used by the integrated circuit device 1. The second rectangular wave signal generation section 12 outputs the second rectangular wave signal 402 as a monitoring signal for monitoring the state of the system clock. In other words, the second rectangular wave signal generation section 12 plays a role of a kind of an internal circuit of a regulator to be described in FIG. 18. Then, regardless of temperature changes, the potential that stops the output of the second rectangular wave signal 402 needs to have a constant potential difference with respect to a stop potential that stops the first rectangular wave signal 408. Therefore, in order to give the same temperature gradients, the circuit structure of the second rectangular wave signal generation section 12 may preferably be the same as that of the first rectangular wave signal generation section 11.

Here, the second amplitude is greater than the first amplitude. Therefore, when the amplitude of the oscillation signal 400 is greater than the first amplitude and smaller than the second amplitude, the first rectangular wave signal 408 is outputted, but the second rectangular wave signal 402 is not outputted. However, when the amplitude of the oscillation signal 400 is greater than the second amplitude, the first rectangular wave signal 408 and the second rectangular wave signal 402 are both outputted.

Then, by appropriately setting the second amplitude, it becomes possible to judge that there is a margin for lowering the regulated voltage when the second rectangular wave signal 402 is outputted. In reverse, when the first rectangular wave signal 408 is outputted but the second rectangular wave signal 402 is not outputted, it can be judged that the integrated circuit device 1 is supplying an appropriate regulated voltage for performing low power consuming operation.

It is noted that, in order for the integrated circuit device 1 to normally operate, the regulated voltage needs to have a higher potential than the stop voltage. The integrated circuit device 1 may be equipped with a function to elevate the regulated voltage, for example, at constant timings, in order to prevent the regulated voltage from nearing the stop voltage due to rapid temperature changes or the like. In this instance, when the second rectangular wave signal 402 starts being outputted due to periodical elevations of the regulated voltage, it is judged that there is a margin to lower the regulated voltage, similarly as described above.

Here, the circuit structure of the second rectangular wave signal generation section 12 is assumed to be the same as that of the first rectangular wave signal generation section 11. In this case, the second rectangular wave signal generation section 12 can realize the second amplitude that is greater than the first amplitude by adjusting the threshold voltage of the transistor. More specifically, by making the threshold voltage of a normal transistor to correspond to the first amplitude, a threshold voltage higher than normal can be made to correspond to the second amplitude. The threshold voltage of a transistor can be adjusted by its gate width W and gate length L in a designing stage. More specifically, when W/L is smaller, the threshold voltage becomes higher. Therefore, the second rectangular wave signal generation section 12 may be composed with a transistor having W/L smaller than that of the transistor of the first rectangular wave signal generation section 11, whereby the second amplitude greater than the first amplitude can be realized.

Also, in a manufacturing stage after the designing stage, the threshold voltage of the transistor can be changed by changing the concentration of ions injected. This method is easy to accommodate changes in the manufacturing stage. Further, it is also possible to make appropriate adjustment based on data and the like obtained from evaluation of prototypes and the like after the designing has been completed.

In the present embodiment, by making the circuit structure of the second rectangular wave signal generation section 12 to be the same as that of the first rectangular wave signal generation section 11, the second rectangular wave signal 402 that is similar in characteristic to the first rectangular wave signal 408 can be obtained. Then, by observing the second rectangular wave signal 402, the state of the first rectangular wave signal 408 can be indirectly grasped. In this case, when the second rectangular wave signal 402 is outputted, it can be judged that there is a margin to lower the regulated voltage, and lower power consumption of the integrated circuit device 1 can be realized by lowering the regulated voltage based on the judgment.

2. Second Embodiment

A second embodiment of the invention will be described with reference to FIG. 2-FIG. 7. It is noted that compositions thereof similar to those of the first embodiment will be appended with the same reference numbers, and their description is omitted, and different aspects will be mainly described.

Figure 2:
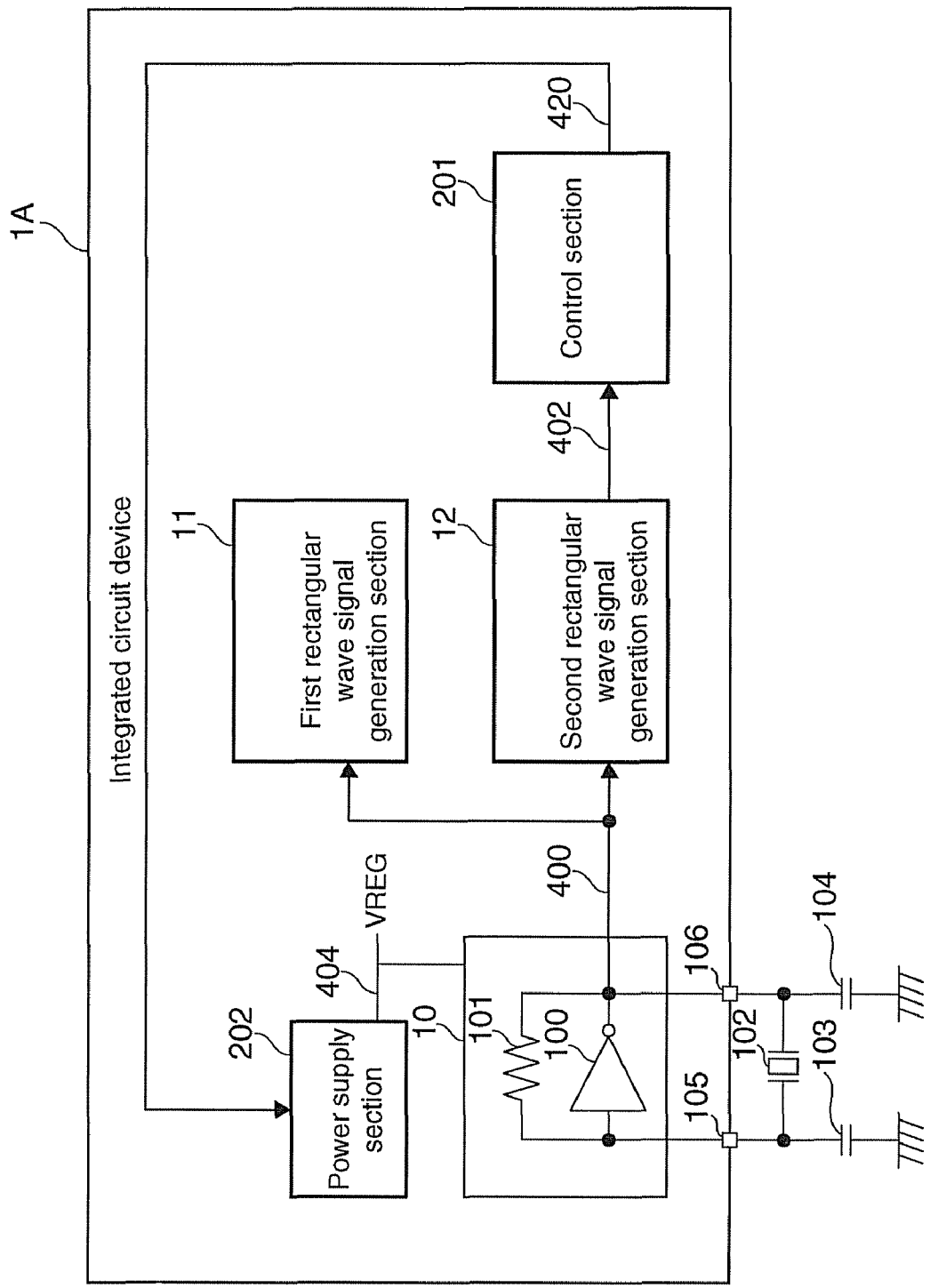
FIG. 2 is a block diagram of an integrated circuit device in accordance with a second embodiment.

FIG. 2 is a block diagram of an integrated circuit device 1A of the present embodiment. The integrated circuit device 1A includes, like the first embodiment, a first rectangular wave signal generation section 11 and a second rectangular wave signal generation section 12. Further, the integrated circuit device 1A includes an inversion amplifier 100 that outputs an oscillation signal 400, a control section 201 that outputs a control signal 420, and a power supply section 202 that generates a regulated voltage 404 to be supplied to at least the inversion amplifier 100 based on the control signal 420.

The inversion amplifier 100 composes a part of an oscillation circuit section 10. The oscillation circuit section 10 may additionally include a feedback resistor 101. In accordance with the present embodiment, the oscillation circuit section 10 is connected to a quartz oscillator 102 and oscillator capacitors 103 and 104 via quartz oscillator connection terminals 105 and 106 of the integrated circuit device 1A. The inversion amplifier 100 outputs an oscillation signal 400 that is a source clock of a system clock of the integrated circuit device 1A. The oscillation signal 400 is inputted in the first rectangular wave signal generation section 11 and the second rectangular wave signal generation section 12, like the first embodiment. In the present embodiment, a first rectangular wave signal 408 (FIG. 1) outputted from the first rectangular wave signal generation section 11 also becomes a system clock.

It is noted that the oscillation circuit 10 may include all or a part of the quartz oscillator 102 and the oscillator capacitors 103 and 104.

The control section 201 outputs a control signal 420 based on whether or not the second rectangular wave signal 402 is outputted. The control signal 420 may be a signal that designates a voltage level of the regulated voltage, or a signal that instructs to lower or elevates the regulated voltage.

The power supply section 202 supplies a regulated voltage (VREG) 404 based on the control signal 420. VREG 404 is supplied to the oscillation circuit section 10 that includes at least the inversion amplifier 100. Here, VREG 404 may be supplied not only to the oscillation circuit section 10 but also to a logic circuit. In other words, VREG 404 may be supplied to all or a part of the first rectangular wave signal generation section 11, the second rectangular wave signal generation section 12 and the control section 201. By supplying VREG 404 that has been stepped down from the external power supply also to the logic circuit, the power consumption of the integrated circuit device 1A is lowered.

Like the first embodiment, when the second rectangular wave signal 402 is outputted, the control section 201 outputs a control signal 420 instructing to lower VREG 404. When the power supply section 202 lowers the voltage of VREG 404, the amplitude of the oscillation signal 400 that is outputted from the inversion amplifier 100 becomes smaller. Even so, if the second rectangular wave signal 402 is still outputted, the control section 201 outputs the control signal 420 that instructs to further lower VREG 404. Then, when the second rectangular wave signal 402 is not outputted any longer, the control section 201 judges that VREG 404 suitable for operating the integrated circuit device 1A with low power consumption is supplied, and controls the control signal 420 in a manner to maintain VREG 404.

Figure 3:
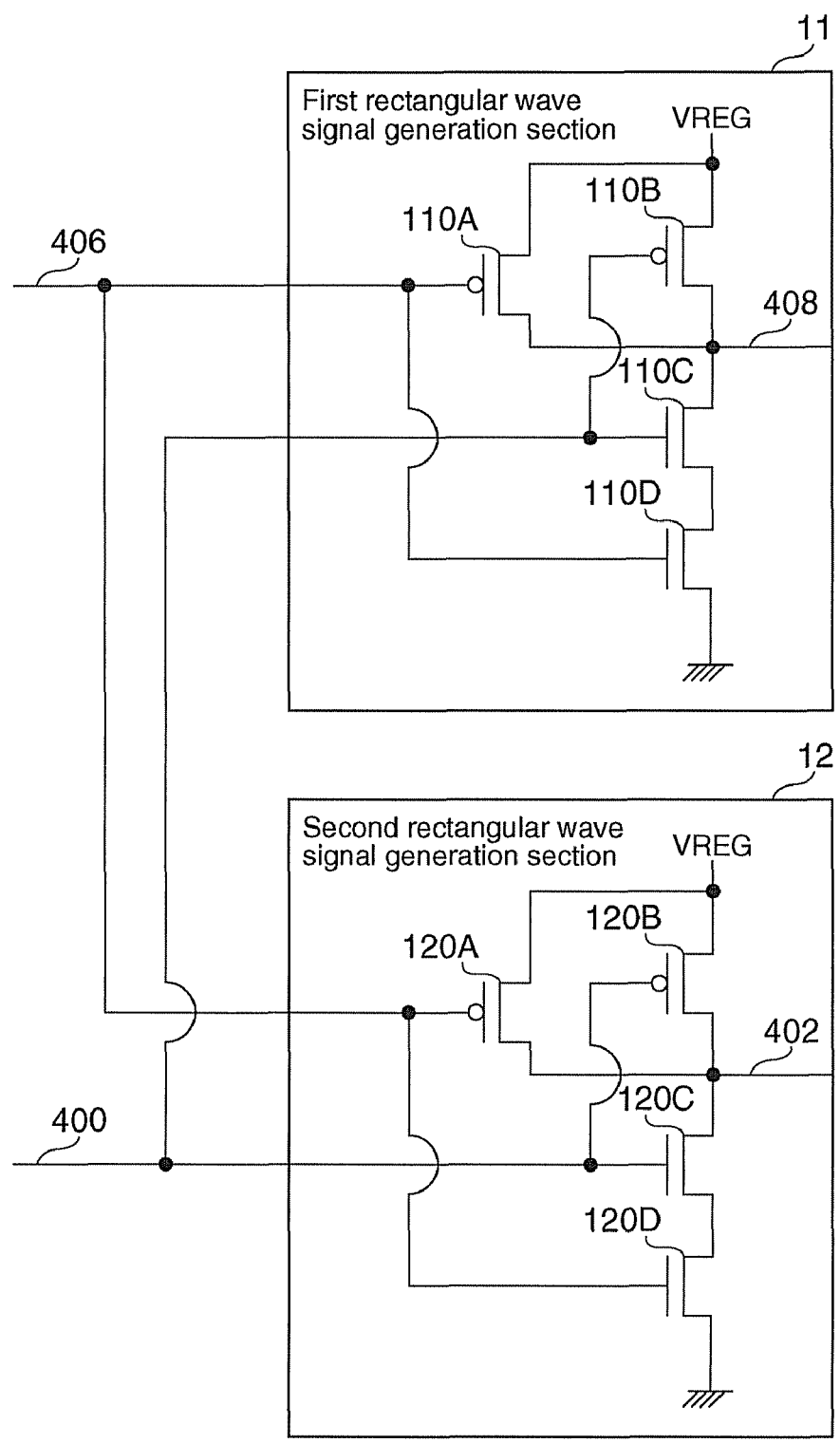
FIG. 3 is a diagram showing an exemplary structure of a first rectangular wave signal generation section and a second rectangular wave signal generation section in accordance with the second embodiment.

FIG. 3 is a diagram showing a circuit structure example of the first rectangular wave signal generation section 11 and the second rectangular wave signal generation section 12 in accordance with the present embodiment. The first rectangular wave signal generation section 11 and the second rectangular wave signal generation section 12 convert the oscillation signal 400 to a rectangular wave and output the same. In this respect, as the most simple structure, the first rectangular wave signal generation section 11 and the second rectangular wave signal generation section 12 may be inverters in which the oscillation signal 400 is inputted. However, according to the present embodiment, a function to stop rectangular waves by a test signal 406 is also added for a test mode or for further reducing the power consumption. The first rectangular wave signal generation section 11 is a NAND circuit composed of transistors 110A-110D, and the second rectangular wave signal generation section 12 is a NAND circuit composed of transistors 120A-120D in the same structure as above. Like the first embodiment, by providing a difference in threshold voltage between the transistors 110A-110D and the transistors 120A-120D, a first amplitude and a second amplitude greater than the first amplitude can be realized.

A first rectangular wave signal 408 is used as a system clock, and a second rectangular wave signal 402 is used for judgment for performing voltage control of VREG 404 in a succeeding stage at the control section 201.

It is noted that, in FIG. 3, a NAND is configured by using VREG and a ground potential, but how a potential is created can be appropriately changed according to each system. For example, the first rectangular wave signal generation section 11 and the second rectangular wave signal generation section 12 may use an external power supply potential VDD and a ground potential, or may use VDD and VREG.

Also, according to the present embodiment, the test signal 406 to be inputted in the first rectangular wave signal generation section 11 and the second rectangular wave signal generation section 12 is commonly shared by them, but two test signals may be inputted in them, respectively. In this case, the first rectangular wave signal 408 and the second rectangular wave signal 402 can be individually stopped. The test signal 406 may be controlled by the control section 201.

Figure 4A:
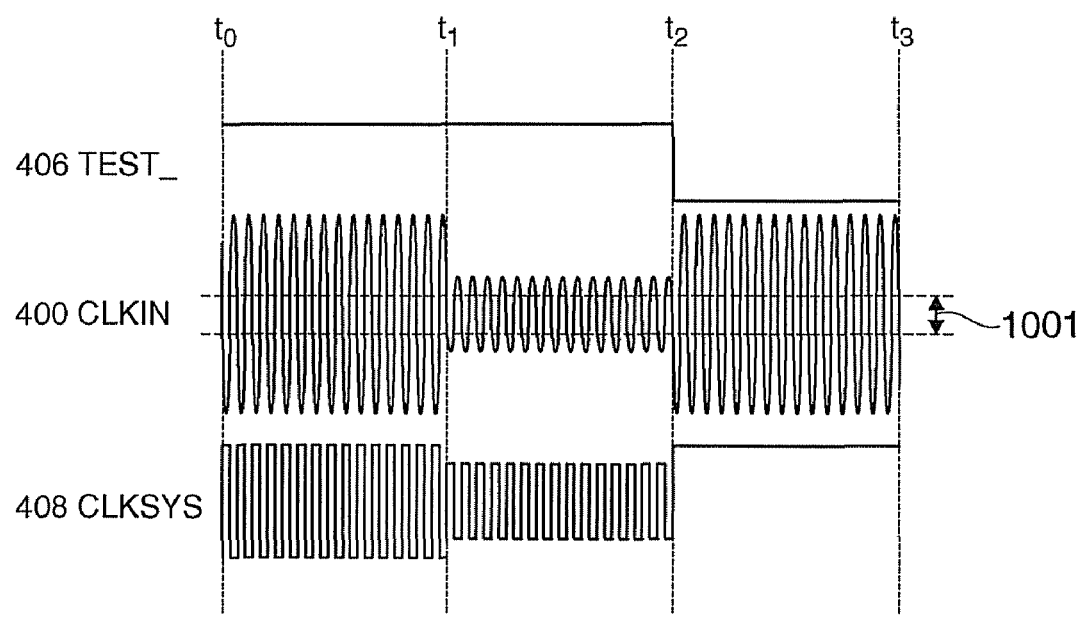

FIG. 4(A) is a waveform diagram showing an input signal and an output signal of the first rectangular wave signal generation section 11 of FIG. 3. Output of the first rectangular wave signal (CLKSYS) 408 is decided based on the logic level of the test signal (TEST.) 406, and whether or not the amplitude of the oscillation signal (CLKIN) 400 is greater than a first amplitude 1001.

In a period $t_0$-$t_2$, the logic level of TEST_ is 1, and CLKSYS 408 would not be forcefully stopped. Therefore, during the period $t_0$-$t_2$, the amplitude of CLKIN 400 is greater than the first amplitude 1001, such that CLKSYS 408 is outputted as a rectangular wave. However, in a period $t_1$-$t_2$, the amplitude of CLKSYS 408 changes due to a reduction in VREG 404.

In a period $t_2$-$t_3$, the logic level of TEST_ is 0, and CLKSYS 408 is forcefully stopped. Therefore, during the period $t_2$-$t_3$, although CLKIN 400 is greater than the first amplitude 1001, CLKSYS 408 is not outputted as a rectangular wave.

Figure 4B:
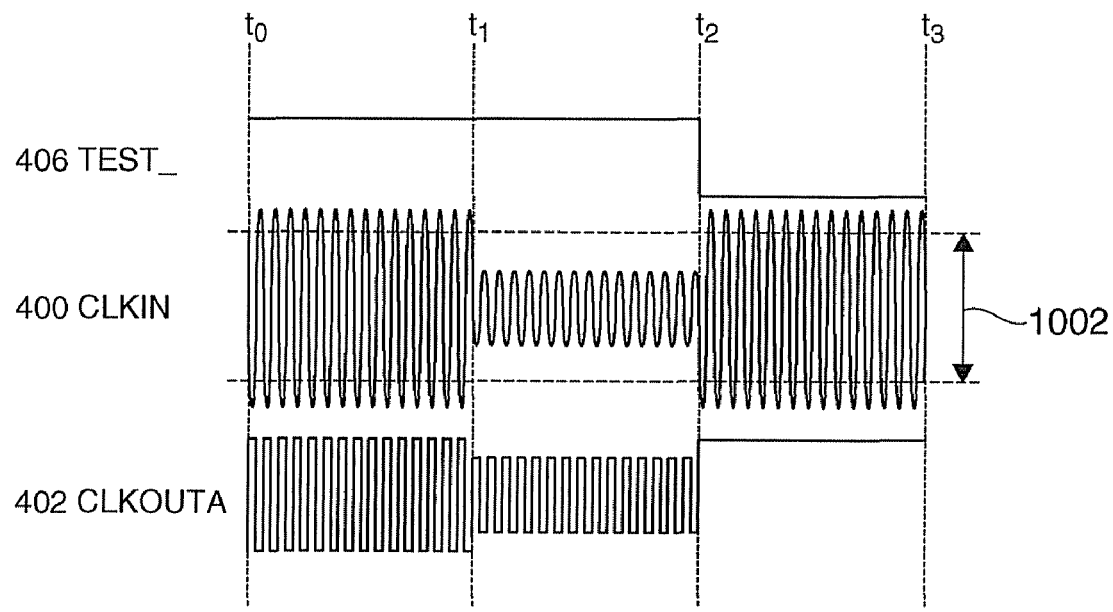

FIG. 4(B) is a waveform diagram showing an input signal and an output signal of the second rectangular wave signal generation section 12 of FIG. 3. Output of the second rectangular wave signal (CLKOUTA) 402 is decided based on the logic level of the test signal (TEST_) 406, and whether or not the amplitude of the oscillation signal (CLKIN) 400 is greater than a second amplitude 1002. It is noted that the second amplitude 1002 is greater than the first amplitude 1001.

In a period $t_0$-$t_2$, the logic level of TEST_ is 1, and CLKOUTA 402 would not be forcefully stopped. Therefore, during the period $t_0$-$t_2$, the amplitude of CLKIN 400 is greater than the second amplitude 1002, such that CLKOUTA 402 is outputted as a rectangular wave. However, in a period $t_1$-$t_2$, the amplitude of CLKIN 400 is smaller than the second amplitude 1002, such that CLKOUTA 402 is not outputted as a rectangular wave.

In a period $t_2$-$t_3$, the logic level of TEST_ is 0, and CLKOUTA 402 is forcefully stopped. Therefore, during the period $t_2$-$t_3$, although CLKIN 400 is greater than the second amplitude 1002, CLKOUTA 402 is not outputted as a rectangular wave.

Figure 5:
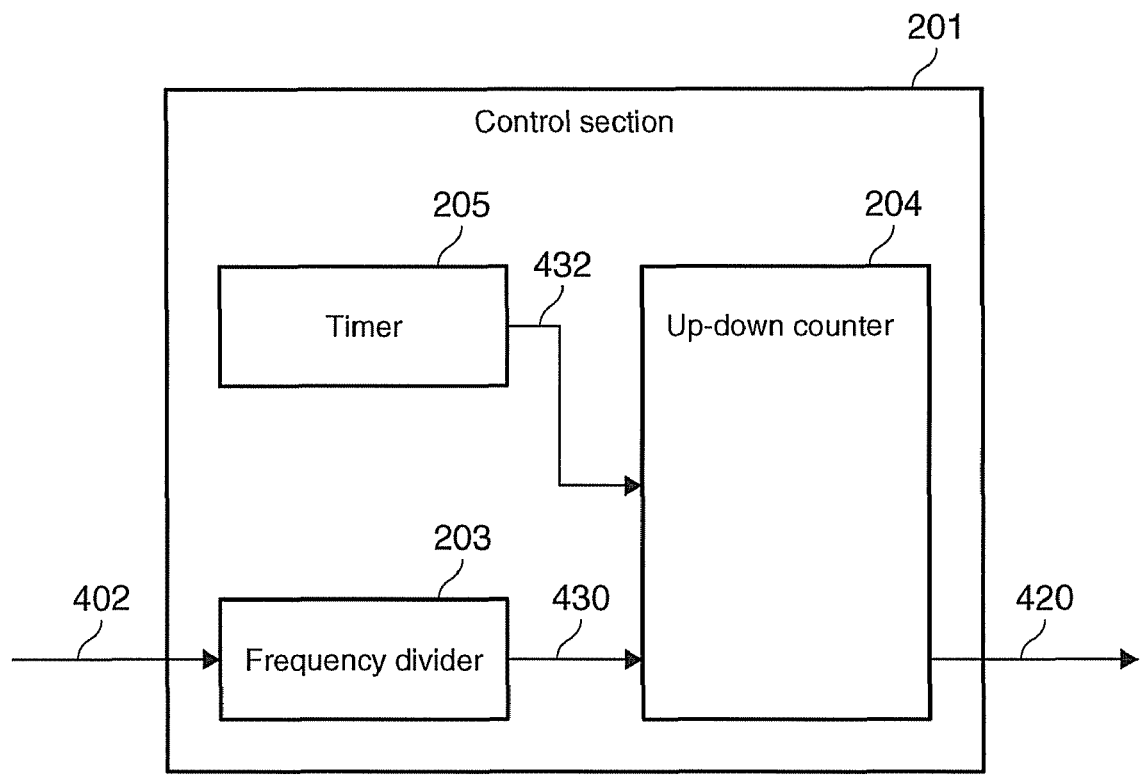
FIG. 5 is a block diagram of a control section in accordance with the second embodiment.

FIG. 5 is a block diagram of the control section 201 in accordance with the present embodiment. The control section 201 includes a frequency divider 203 that frequency-divides the inputted second rectangular wave signal 402, and an up-down counter 204. The control section 201 may further include a timer 205. The control section in the present embodiment outputs a count value of the up-down counter 204 as a control signal 420, and the power supply section 202 changes VREG 404 according to the count value.

A frequency-divided signal 430 of the second rectangular wave signal from the frequency-divider 203 gives a timing for counting down the count value of the up-down counter 204. Generally, the ambient temperature in which the integrated circuit device 1A is used gently changes, compared to the period of the second rectangular wave signal 402. Therefore, the interval of judging as to whether or not the second rectangular wave signal 402 is outputted is made greater by the frequency-divider 203. For example, the frequency-divider 203 may give, to the up-down counter 204, a signal of which the second rectangular wave signal 402 is frequency-divided by 8.

When it is judged that the frequency-divided signal 430 of the second rectangular wave signal is outputted, the up-down counter 204 decrements the count value to lower the voltage of VREG 404, and outputs the same as a control signal 420.

The timer 205 may give a timer output signal 432 at a constant period to the up-down counter 204. The up-down counter 204 may increment the count value to elevate the voltage of VREG 404 when the timer output signal 432 is inputted. Periodical up-count requests from the timer are effective in preventing VREG 404 from reaching the stop voltage.

It is noted that the control section 201 may have a function to increment or decrement the count value of the up-down counter in response to an input from a temperature sensor unshown in the figure.

Figure 6:
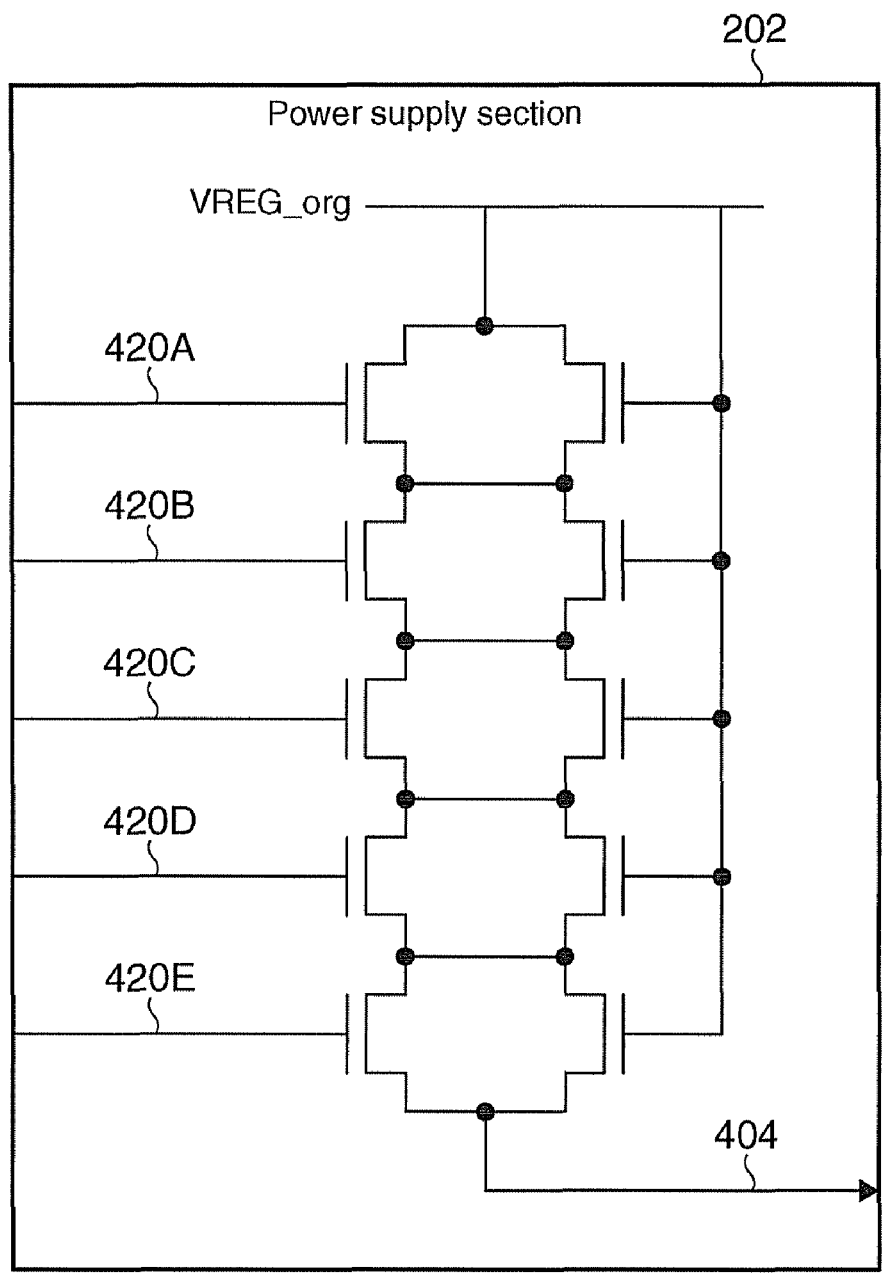
FIG. 6 is a diagram showing an exemplary structure of a power supply section in accordance with the second embodiment.

FIG. 6 is a diagram showing an exemplary structure of the power supply section 202 in accordance with the present embodiment. The power supply section 202 receives the count value of the up-down counter 204 as a control signal 420 from the control section 201. In the present embodiment, it is assumed that the control signal 420 is of 5 bits, and each of input signals 420A-420E of the power supply section 202 is a bit signal. It is noted that "5 bits" is an example, and the control signal 420 may be in any bits. Also, VREG_org is a potential of VREG 404 before being adjusted by the control signal 420.

The circuit of the power supply section 202 has resistance values weighted according to the bits in the form of NMOS switches with gates connected to VREG_org. Then, when the logic level is 0, a voltage drop occurs for that bit by the aforementioned resistance value. For example, when the control signal 420 is made up of 0×1F (all 1s), the potential of VREG 404 is VREG_org. However, in other cases, the potential of VREG 404 assumes a value that is stepped down from VREG_org according to the value of the control signal 420.

Figure 7:
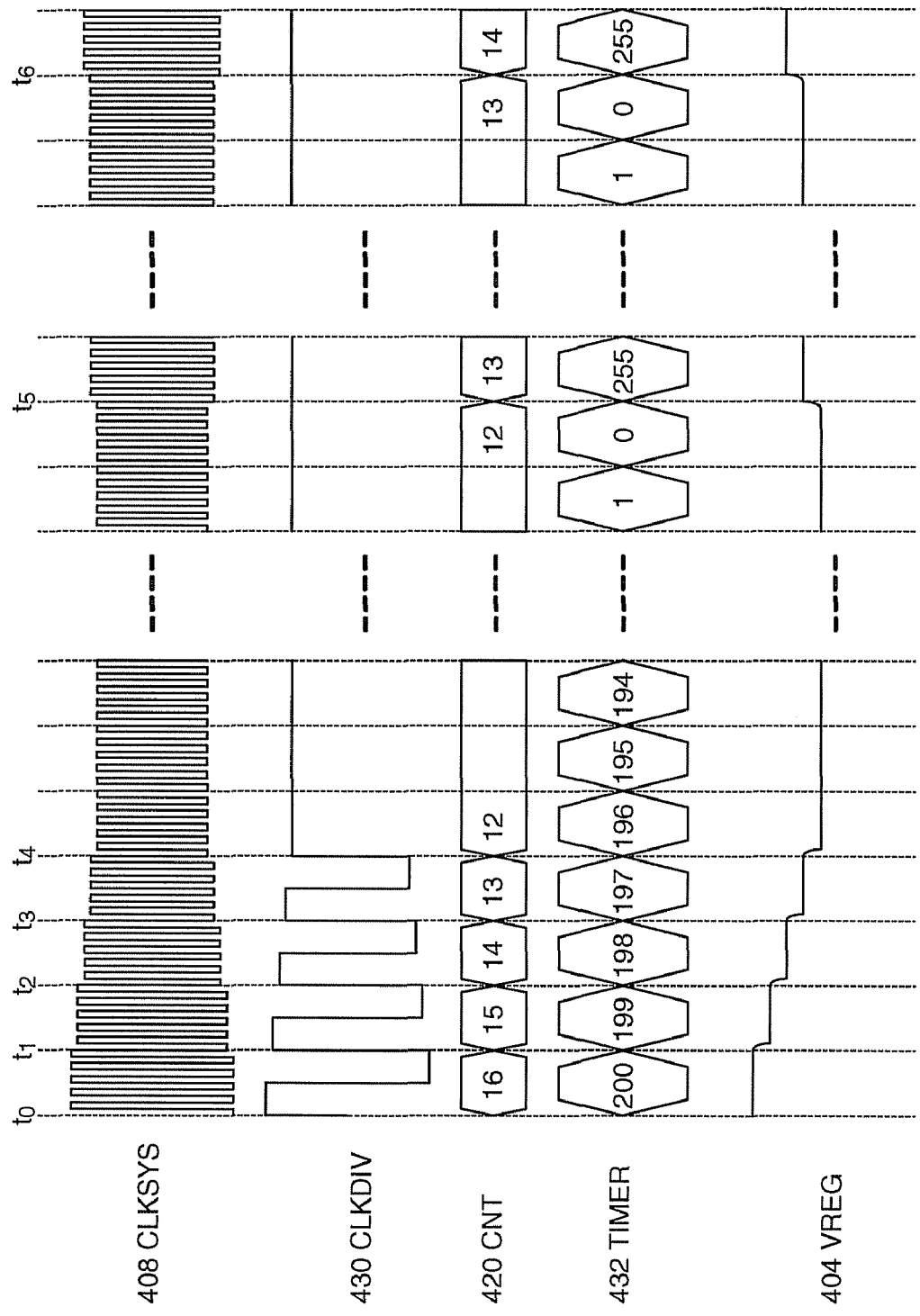
FIG. 7 includes waveform diagrams showing examples of changes in the regulated voltage in accordance with the second embodiment.

FIG. 7 is a waveform diagram showing an example of changes in the regulated voltage (VREG) 404 in accordance with the present embodiment. CLKSYS 408 is a first rectangular wave signal that is an output of the first rectangular wave signal generation section 11. Here, the second rectangular wave signal generation section 12 has the same circuit structure as that of the first rectangular wave signal generation section 11, and the second rectangular wave signal 402 and CLKSYS 408 have the same cycle.

CLKDIV 430 is a signal that is obtained by frequency-dividing the second rectangular wave signal 402 by the frequency-divider 203. In synchronism with CLKDIV 430, the count value CNT 420 of the up-down counter 204 and the timer value 432 of the timer 205 change.

In a period $t_0$-$t_4$, the second rectangular wave signal 402 is outputted from the second rectangular wave signal generation section 12, such that CLKDIV 430 is also in a rectangular wave. When the second rectangular wave signal 402 is outputted, there is a margin for lowering VREG 404, and thus the control section 201 decrements the control signal (CNT) 420 that is a value of the up-down counter 204 in synchronism with rising edges ($t_1$, $t_2$, $t_3$, $t_4$) of CLKDIV 430. Then, according to CNT 420, the voltage value of the regulated voltage (VREG) 404 also lowers. Also, the control section 201 has a function to periodically increment CNT 420 so that VREG 404 does not reach the stop voltage. The timing of such moment is determined by the timer value (TIMER) 432 from the timer 205. In the embodiment example, when TIMER 430 becomes to be 0, CNT 420 is incremented. In the period $t_0$-$t_4$ also, TIMER 432 is decremented at each period of CLKDIV 430.

In a period $t_4$-$t_5$, CLKDIV 430 is not in a rectangular wave, and the value of CNT 420 remains to be 12. However, the value of TIMER 432 is decremented at each period of CLKDIV 430 even during this period. Then, at $t_5$, TIMER 432 becomes to be 0, and then CNT 420 is incremented. At time to also, CNT 420 is likewise incremented. Thus, the voltage of VREG 404 changes according to the values of CNT 420.

In accordance with the present embodiment, VREG 404 can be adjusted to suitable voltages by using the frequency-divided signal (CLKDIV) 430 of the second rectangular wave signal and the timer 205, such that the power consumption of the integrated circuit device can be made smaller.

It is noted that, in accordance with the present embodiment, the judgment by the control section 201 is performed at each period of CLKVID 430, and therefore the second rectangular wave signal (CLKOUTA) 402 from the second rectangular wave signal generation section 12 may be stopped during other times. More specifically, the control section 201 may measure the timing for judgment by the first rectangular wave signal (CLKSYS) 408, and may perform a control such that a signal that is the test signal (TEST_) 406 in FIG. 3 and is to be inputted in the second rectangular wave signal generation section 12 becomes to be the logic level of 0 during the time other than those at which the judgment is performed. By this, the power consumption of the integrated circuit device 1A can be further suppressed.

3. Third Embodiment

A third embodiment of the invention will be described with reference to FIG. 8-FIG. 14. It is noted that compositions thereof similar to those of the first embodiment or the second embodiment are appended with the same reference numbers and their description is omitted, and different aspects are mainly described.

Figure 8:
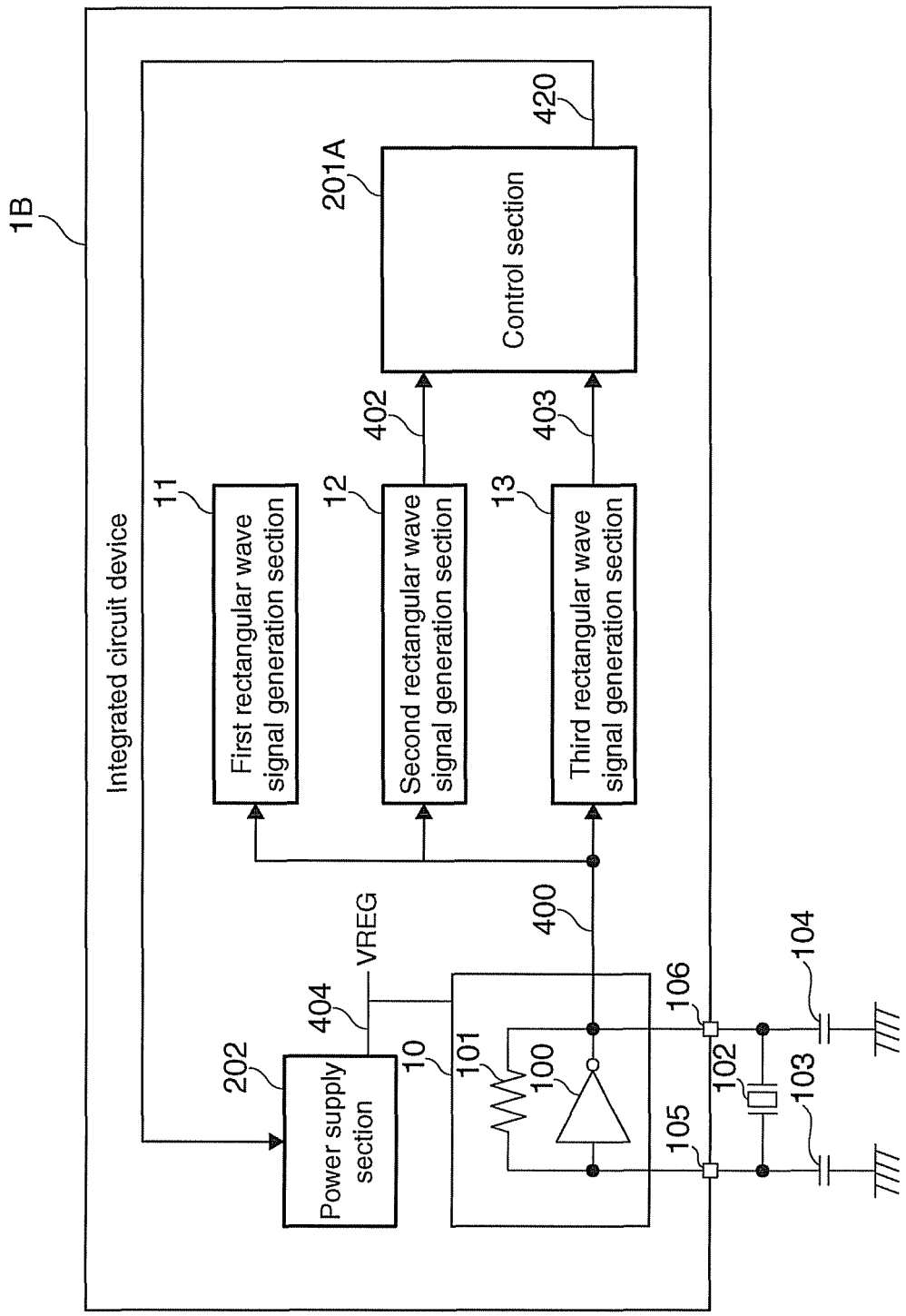
FIG. 8 is a block diagram of an integrated circuit device in accordance with a third embodiment.

FIG. 8 is a block diagram of an integrated circuit device 1B in accordance with the present embodiment. The integrated circuit device 1B includes a third rectangular wave signal generation section 13, in addition to the components of the integrated circuit device 1A in accordance with the second embodiment. Therefore, the control section 201A receives not only the second rectangular wave signal 402 but also a third rectangular wave signal 403.

The third rectangular wave signal generation section 13 outputs the third rectangular wave signal 403 based on an oscillation signal 400, when the oscillation signal 400 has an amplitude greater than a third amplitude that is greater than a first amplitude but smaller than the second amplitude. In the present embodiment, instead of periodical voltage elevations by the timer used in the second embodiment, the voltage of VERG 404 is elevated by a judgment that VREG 404 is nearing the stop voltage when the second rectangular wave signal 402 and the third rectangular wave signal 403 are not outputted.

Figure 9:
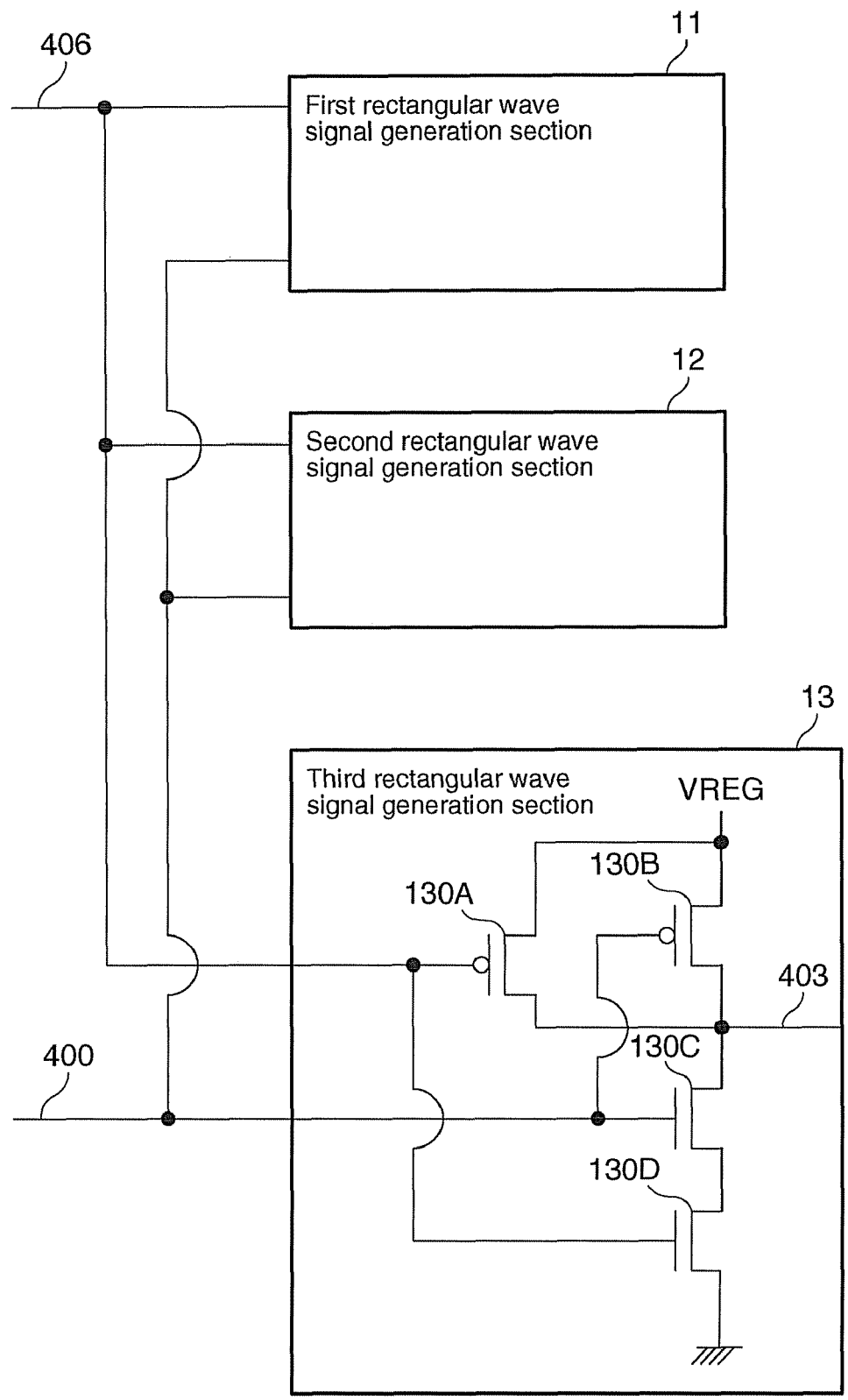
FIG. 9 is a diagram showing an exemplary structure of a third rectangular wave signal generation section in accordance with the third embodiment.

FIG. 9 is a diagram of an exemplary structure of the third rectangular wave signal generation section 13 in accordance with the present embodiment. Like the first rectangular wave signal generation section 11 and the second rectangular wave signal generation section 12 in FIG. 3, the third rectangular wave signal generation section 13 is a NAND circuit made up of transistors 130A-130D. In FIG. 9, a test signal 406 is commonly inputted in the first rectangular wave signal generation section 11, the second rectangular wave signal generation section 12 and the third rectangular wave signal generation section 13, but three test signals may be individually inputted therein, respectively. In this case, the first rectangular wave signal 408, the second rectangular wave signal 402 and the third rectangular wave signal 403 can be individually stopped. In this case, like the second embodiment, for example, the second and third rectangular wave signal generation sections or the control section may stop output of one or both of the second rectangular wave signal generation section 12 and the third rectangular wave signal generation section 13 in the time other than those when the control section 201A in a succeeding stage performs judgment. By this, the power consumption of the integrated circuit device 1A can be further suppressed.

Also, the threshold voltage of transistors composing the third rectangular wave signal generation section 13 may be adjusted by a method different from that for the transistors composing the second rectangular wave signal generation section 12. For example, for transistors of one of the rectangular wave signal generation sections with a higher possibility of performing feedback by measuring actual measurement values with prototypes after their designing, their threshold voltage may be adjusted by using a concentration adjusting method or the like at the time of ion injection at the time of manufacturing. Further, for transistors of the other rectangular wave signal generation section, the threshold voltage may be adjusted by changing their gate width and the gate length at the time of designing. More specifically, for the second rectangular wave signal generation section 12, the threshold voltage of the transistors may be adjusted by a concentration adjusting method or the like at the time of ion injection; and for the third rectangular wave signal generation section 13, the threshold voltage may be adjusted by changing the gate width and gate length of the transistors. Alternatively, in reverse, for the second rectangular wave signal generation section 12, the threshold voltage may be adjusted by changing the gate width and gate length of the transistors.

Figure 10:
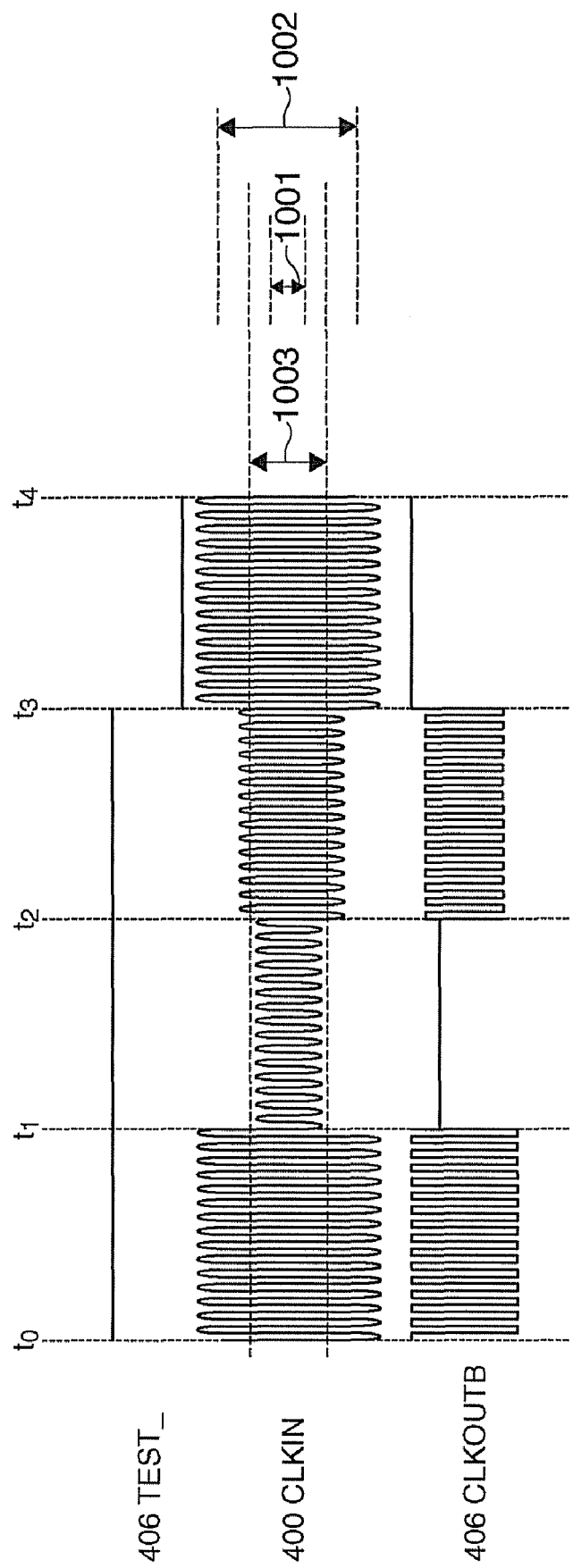

FIG. 10 is a waveform diagram showing an output signal and an input signal of the third rectangular wave signal generation section 13 of FIG. 9. Output of a third rectangular wave signal (CLKOUTB) 403 is decided based on the logic level of the test signal (TEST_) 406, and whether or not the amplitude of the oscillation signal (CLKIN) 400 is greater than a third amplitude 1003. It is noted here that, as shown in FIG. 10, the third amplitude 1003 is greater than the first amplitude 1001, and smaller than the second amplitude 1002.

In a period $t_0$-$t_3$, the logic level of TEST_ is 1, and CLKOUTB 403 would not be forcefully stopped. Therefore, during the period $t_0$-$t_2$ and the period $t_2$-$t_3$, the amplitude of CLKIN 400 is greater than the third amplitude 1003, such that CLKOUTB 403 is outputted as a rectangular wave. However, in a period $t_1$-$t_2$, the amplitude of CLKIN 400 is smaller than the third amplitude 1003, such that CLKOUTB 403 is not outputted as a rectangular wave. It is noted that, in the period $t_2$-$t_3$, the rectangular wave of CLKOUTB 403 has an amplitude smaller than that in the period $t_0$-$t_1$, due to the reduction in voltage of VREG 404.

Also, in a period $t_3$-$t_4$, the logic level of TEST_ is 0, and CLKOUTB 403 is forcefully stopped. Therefore, in the period $t_3$-$t_4$, although CLKIN 400 is greater than the third amplitude 1003, CLKOUTB 403 is not outputted as a rectangular wave.

Figure 11:
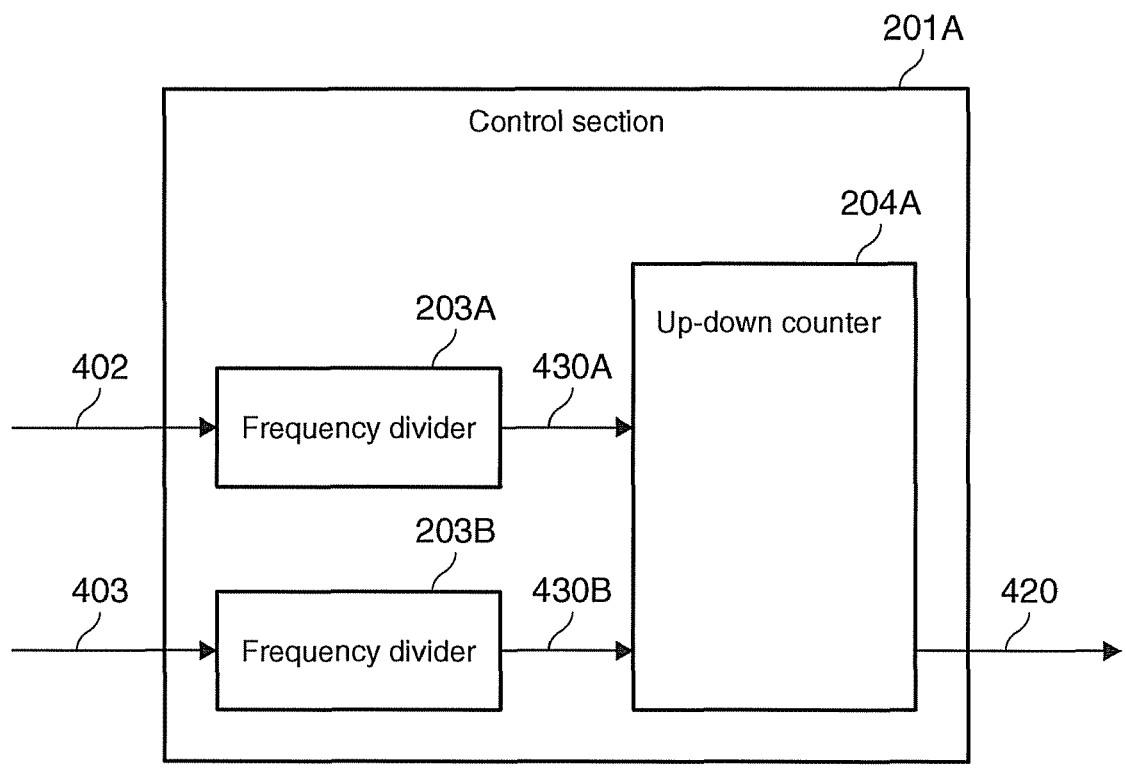
FIG. 11 is a block diagram of a control section in accordance with the third embodiment.

FIG. 11 is a block diagram of a control section 201A in accordance with the present embodiment. Unlike the second embodiment, the control section 201A includes not only a frequency-divider 203A that frequency-divides the inputted second rectangular wave signal 402 but also a frequency-divider 203B that frequency-divides the inputted third rectangular wave signal 403. Also, the control section 201A includes an up-down counter 204A, like the second embodiment. The up-down counter 204A receives a frequency-divided signal 430A of the second rectangular wave signal and a frequency-divided signal 430B of the third rectangular wave signal from the frequency-divider 203A and the frequency-divider 203B, respectively.

The frequency-divided signal 430A of the second rectangular wave signal gives a timing for counting down the count value of the up-down counter 204A, like the second embodiment. However, as for the frequency-divided signal 430B of the third rectangular wave signal, the count value of the up-down counter 204A needs to be incremented when the frequency-divided signal 430B is not outputted. Therefore, the up-down counter 204A automatically increments the count value, for example, at each period of the frequency-divided signal 430B of the third rectangular wave signal. Then, when it is judged that the frequency-divided signal 430B of the third rectangular wave signal is being outputted, the count value is decremented in order to cancel out the automatically incremented value.

By such an operation, the up-down counter 204A of the control section 201A increments or decrements the count value at a constant period (as a specific example, at a period of the frequency-divided signal 430A, 430B), depending on whether or not the second rectangular wave signal 402 and the third rectangular wave signal 403 are rectangular waves.

Figure 12:
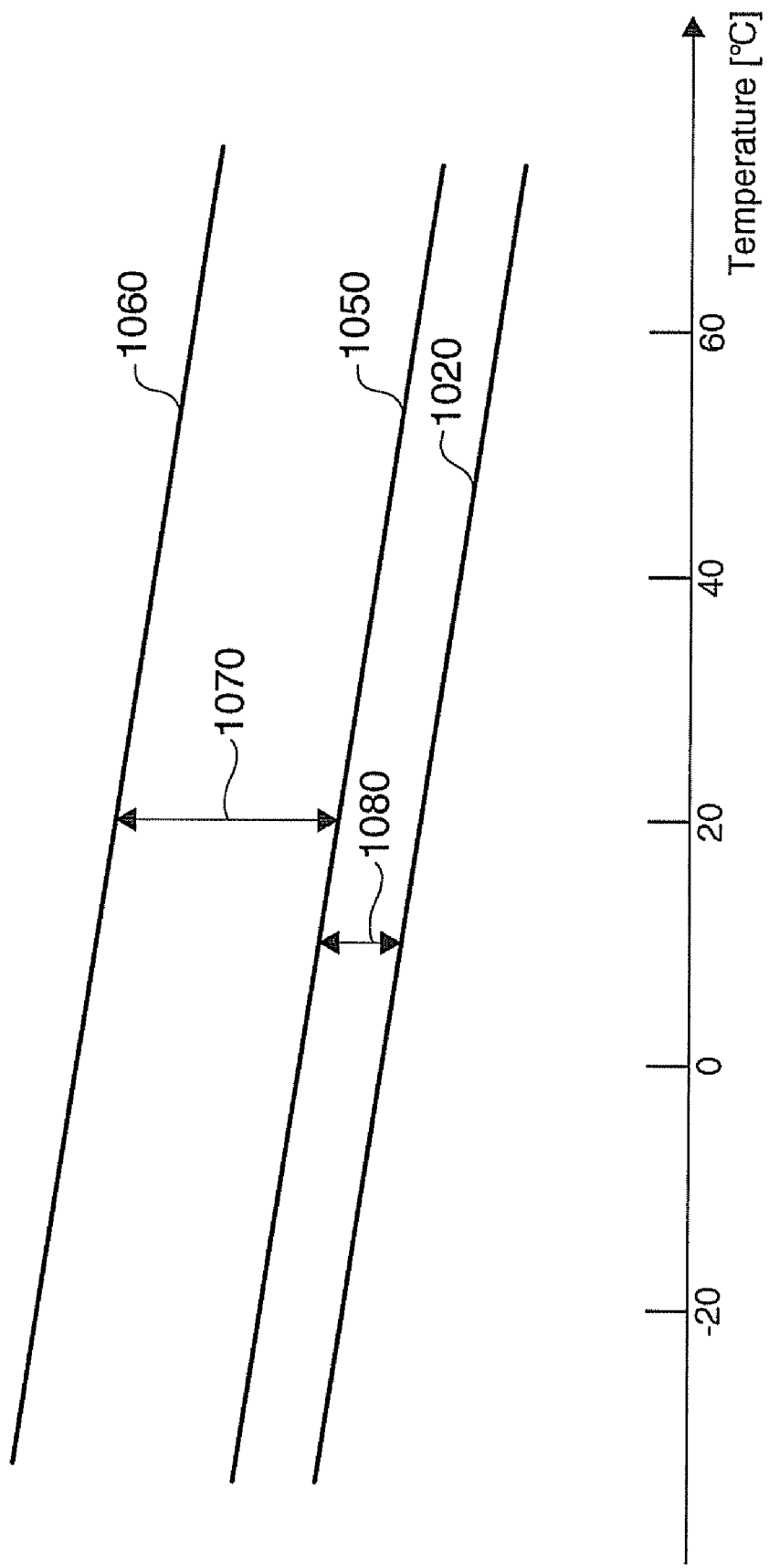
FIG. 12 is a graph showing changes in the stop voltage cause by temperature in accordance with the third embodiment.

FIG. 12 is a graph showing changes in the stop voltage due to temperature in accordance with the present embodiment. As the voltage of VREG 404 lowers to a stop voltage 1020, the first rectangular wave signal (CLKSYS) 408 would no longer be outputted from the first rectangular wave signal generation section 11, such that the function of the integrated circuit device 1B stops.

Here, a voltage value with a stop voltage margin 1080 added to the stop voltage 1020 defines a regulated voltage lower limit value 1050. The regulated voltage may be included between the regulated voltage lower limit value 1050 and a regulated voltage upper limit value 1060 (in a regulated voltage setting range 1070). In the present embodiment, the reference voltage lower limit value 1050 is a voltage value of the regulated voltage (VREG) 404 at which the third rectangular wave signal (CLKOUTB) 403 is no longer outputted from the third rectangular wave signal generation section 13. Also, the regulated voltage upper limit value 1060 is a voltage value of the regulated voltage (VREG) 404 at which the second rectangular wave signal (CLKOUTA) 402 starts being outputted from the second rectangular wave signal generation section 12. Therefore, in a state in which CLKOUTB 403 is outputted as a rectangular wave, but CLKOUTA 402 is not outputted as a rectangular wave, VREG 404 is set in the appropriate voltage range 1070. In this instance, as the voltage of VREG 404 is lower than the regulated voltage upper limit value 1060, the integrated circuit device 1B is operating with low power consumption. Also, as the voltage of VREG 404 is higher than the regulated voltage lower limit value 1050, it is not likely that the operation of the integrated circuit device 1B will stop.

FIG. 13 is a table showing judgments of the control section 201. The state in which rectangular waves are not outputted from the first rectangular wave signal generation section 11 and the second rectangular wave signal generation section 12 is expressed as a fixed value in FIG. 13.

When the third rectangular wave signal 403 is at the fixed value, the second amplitude is greater than the third amplitude, such that the second rectangular wave signal 402 also becomes to be the fixed value. In this instance, the voltage of VREG 404 is lower than the regulated voltage lower limit value 1050, such that the control section 201 instructs an elevation of VREG 404. In the present embodiment, the count value of the up-down counter 204A is incremented to make it greater.

When the second rectangular wave signal 402 and the third rectangular wave signal 403 are rectangular waves, the voltage of VREG 404 is higher than the regulated voltage upper limit value 1060, such that the control section 201 instructs to lower VREG 404 for lower power consuming operation. In the present embodiment, the count value of the up-down counter 204A is decremented to make it smaller.

Then, when the second rectangular wave signal 402 is at the fixed value, and the third rectangular wave signal 403 is a rectangular wave, the voltage value of VREG 404 is appropriate.

Figure 14:
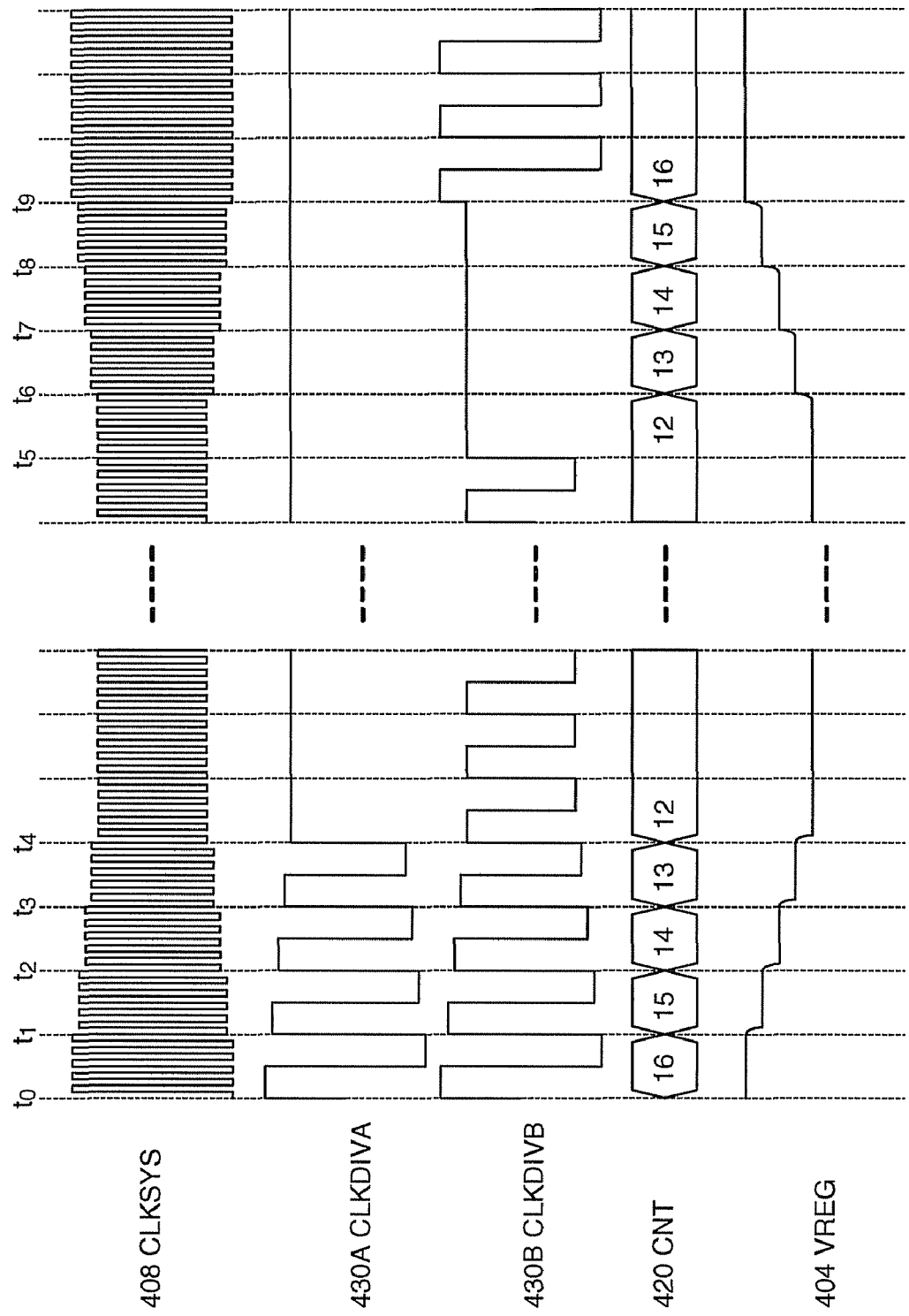
FIG. 14 includes waveform diagrams showing examples of changes in the regulated voltage in accordance with the third embodiment.

FIG. 14 is a waveform diagram showing an example of changes in the regulated voltage (VREG) 404 in accordance with the present embodiment.

In a period $t_0$-$t_4$, the frequency-divided signal (CLKDIVA) 430A of the second rectangular wave signal and the frequency-divided signal (CLKDIVB) 430B of the third rectangular wave signal are rectangular waves, in other words, the second rectangular wave signal 402 and the third rectangular wave signal 403 are rectangular waves, such that the control section 201 decrements the count value of the up-down counter 204A to make it smaller. In FIG. 14, the control section 201 decrements the control signal (CNT) 420 that is a value of the up-down counter 204A at time $t_1$, $t_2$, $t_3$ and $t_4$. Then, in association with this, the voltage of VREG 404 also lowers.

In a period $t_4$-$t_5$, CLKDIVA 430A is at the fixed value, and CLKDIVB 430B is a rectangular wave. As the voltage value of VREG 404 is appropriate, the control section 201A maintains CNT 420 as is.

In a period $t_5$-$t_9$, CLKDIVA 430A and CLKDIVB 430B are at the fixed value, such that the control section 201A increments the count value of the up-down counter 204A to make it larger. In FIG. 14, the control section 201A increments CNT 420 that is a value of the up-down counter 204A at time $t_6$, $t_7$, $t_8$ and $t_9$. Then, in association with this, the voltage of VREG 404 also elevates.

4. Fourth Embodiment

A fourth embodiment of the invention will be described with reference to FIG. 15-FIG. 16.

Figure 15:
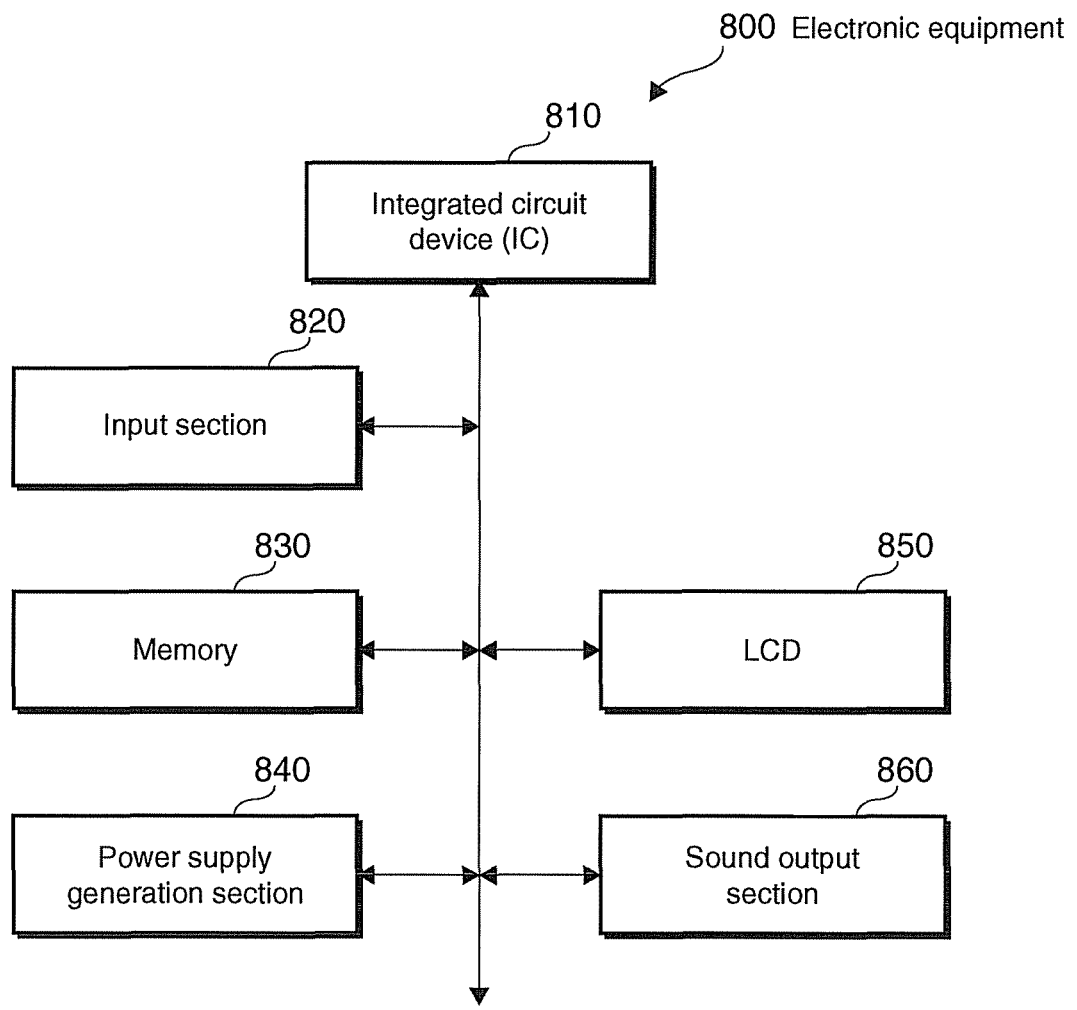
FIG. 15 is a block diagram of electronic equipment in accordance with a fourth embodiment.

FIG. 15 is a block diagram of electronic equipment 800 in accordance with the present embodiment. The electronic equipment 800 includes an integrated circuit device 810, an input section 820, a memory 830, a power supply generation section 840, an LCD 850, and a sound output section 860. The integrated circuit device 810 corresponds to one of the integrated circuit devices 1, 1A and 1B of the first-third embodiments.

Here, the input section 820 is for inputting various data. The integrated circuit device 810 performs various processings based on the data inputted from the input section 820. The memory 830 may be used as a work area for the integrated circuit device 810 and the like. The power supply generation section 840 is for generating various kinds of power supply to be used by the electronic equipment 800. The integrated circuit device 810 generates a regulated voltage by stepping down the power supply (external power supply) supplied from the power supply generation section 840.

The LCD 850 is for outputting various kinds of images (characters, icons, graphics and the like) to be displayed by the electronic equipment 800. The sound output section 860 is for outputting various kinds of sound (voice, game sound and the like), and its function can be realized by hardware such as a speaker.

Figure 16A:
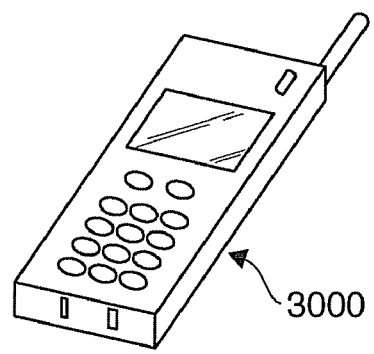
FIG. 16(A) is an illustration of a portable telephone that is an example of the electronic equipment.

FIG. 16(A) shows an example of the external appearance of a portable telephone 3000 that is one of the electronic equipment. The portable telephone 3000 may use the integrated circuit device 810 for the purpose of lowering its power consumption.

Figure 16B:
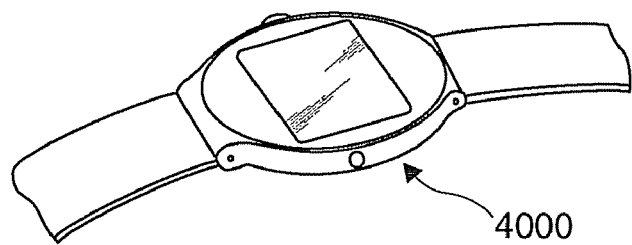
FIG. 16(B) is an illustration of a wrist watch that is an example of the electronic equipment.

FIG. 16(B) shows an example of the external appearance of a wrist watch 4000 that is one of the electronic equipment. In the wrist watch 4000, its stop voltage changes according to various changes in the environment it is used. As it requires low power consumption, the integrated circuit device 810 that can adjust the regulated voltage to an appropriate voltage according to the condition may be used.

Figure 16C:
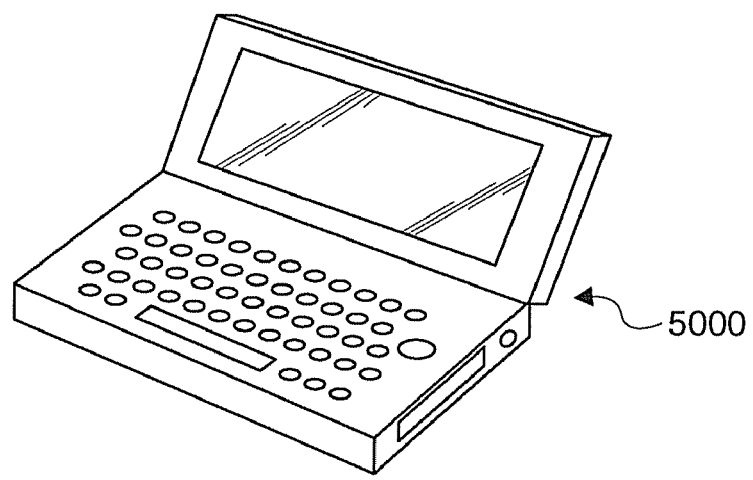
FIG. 16(C) is a personal computer that is an example of the electronic equipment.

FIG. 16(C) shows an example of the external appearance of a personal computer 5000 that is one of the electronic equipment. The personal computer 5000 requires an RTC (real time clock) for accurate time information. As it is battery-driven, the function of RTC that requires low power consumption may be gained from the integrated circuit device 810.

By incorporating the integrated circuit device of the present embodiment in the electronic equipment shown in FIG. 16(A)-FIG. 16(C), the electronic equipment 800 with low power consumption can be provided.

5. Fifth Embodiment

Figure 17:
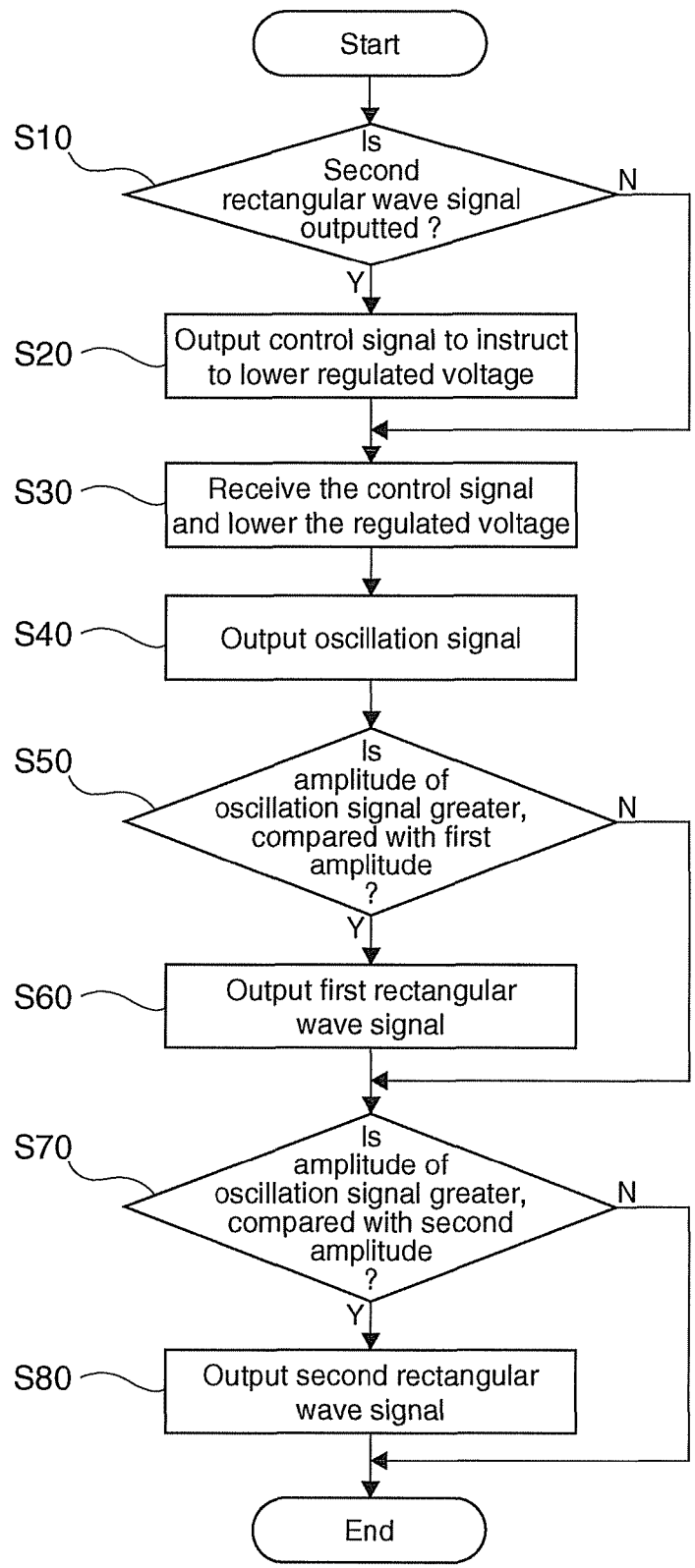
FIG. 17 is a flow chart showing a method for controlling a regulated voltage of an integrated circuit device in accordance with a fifth embodiment.

A fifth embodiment of the invention will be described with reference to FIG. 17. A method for controlling an integrated circuit device in accordance with the second embodiment may be shown in a flow chart in FIG. 17.

In the integrated circuit device, first, it is judged as to whether or not the second rectangular wave signal is being outputted (S10). When the second rectangular wave signal is being outputted (Y in S10), there is a margin for lowering the regulated voltage 404. Then, a control signal that instructs to lower the regulated voltage is outputted (S20). Thereafter, the regulated voltage lowers based on the control signal (S30). If the second rectangular wave signal is not being outputted (N in S10), the regulated voltage is maintained.

Then, the oscillation signal is outputted (S40). When the regulated voltage lowers, the amplitude of the oscillation signal has become small.

It is judged as to whether the amplitude of the oscillation signal is greater, compared with the first amplitude (S50), and if it is greater, the first rectangular wave signal is outputted (S60). The first rectangular wave signal may be used as, for example, a system clock.

Then, it is judged as to whether the amplitude of the oscillation signal is greater, compared with the second amplitude (S70), and if it is greater, the second rectangular wave signal is outputted (S80). The second amplitude is greater than the first amplitude. Therefore, when the second rectangular wave signal is being outputted (Y is S10), it is judged that there is a margin for lowering the regulated voltage. When the second rectangular wave signal stops being outputted (N in S10), it is judged that the regulated voltage is within the appropriate range.

By following the control (S10-S80), the regulated voltage can be lowered to an appropriate voltage, such that the power consumption of the integrated circuit device can be made smaller.

The invention is not limited to the above-described examples, and include compositions that are substantially the same as the compositions described in the embodiments (for example, a composition with the same function, method and result, or a composition with the same objects and result). Also, the invention includes compositions in which portions not essential in the compositions described in the embodiments are replaced with others. Also, the invention includes compositions that achieve the same functions and effects or achieve the same objects of those of the compositions described in the embodiments. Furthermore, the invention includes compositions that include publicly known technology added to the compositions described in the embodiments.

The invention claimed is:

1. An integrated circuit device comprising:
a first rectangular wave signal generation section that outputs a first rectangular wave signal after an amplitude of an inputted oscillation signal is greater than a first amplitude;
a second rectangular wave signal generation section that outputs a second rectangular wave signal after the amplitude of the inputted oscillation signal is greater than a second amplitude that is greater than the first amplitude;
an inversion amplifier that outputs the oscillation signal;
a control section that outputs a first control signal; and
a power supply section that supplies a regulated voltage at least to the inversion amplifier, wherein
the control section outputs the first control signal to lower the regulated voltage while the second rectangular wave signal is outputted, and
the power supply section lowers the regulated voltage after receiving the first control signal to lower the regulated voltage.

2. The integrated circuit device according to claim 1,
wherein the control section outputs a second control signal to elevate the regulated voltage at a given timing, and
the power supply section elevates the regulated voltage after receiving the second control signal to elevate the regulated voltage.

3. The integrated circuit device according to claim 1, further comprising:
a third rectangular wave signal generation section that outputs a third rectangular wave signal based on the oscillation signal, after the amplitude of the oscillation signal is greater than a third oscillation that is greater than the first oscillation but smaller than the second oscillation,
wherein the control section outputs the second control signal to elevate the regulated voltage, after neither the second rectangular wave signal nor the third rectangular wave signal is being outputted, and
the power supply section elevates the regulated voltage after receiving the second control signal to elevate the regulated voltage.

4. The integrated circuit device recited in claim 3,
wherein at least one of the second rectangular wave signal generation section and the third rectangular wave signal generation section has a transistor that composes the at least one rectangular wave signal generation section and the transistor has at least one of a gate width and a gate length that is different from that of a transistor of the first rectangular wave signal generation section.

5. The integrated circuit device recited in claim 3,
wherein at least one of the second rectangular wave signal generation section and the third rectangular wave signal generation section has a transistor that composes the at least one rectangular wave signal generation section and the transistor has a threshold voltage that is different from that of a transistor of the first rectangular wave signal generation section.

6. The integrated circuit device recited in claim 3,
wherein a second transistor of the second rectangular wave signal generation section has a threshold voltage that is different from a first transistor of the first rectangular wave signal generation section, and
a third transistor of the third rectangular wave signal generation section has at least one of a gate width and a gate length that is different from that of the first transistor of the first rectangular wave signal generation section.

7. The integrated circuit device according to claim 1,
wherein the control section outputs the first or second control signal to reduce or elevate the regulated voltage at a given timing.

8. The integrated circuit device recited in claim 7,
wherein the second rectangular wave signal generation section or the third rectangular wave signal generation section stops at least one of:
the output of the second rectangular wave signal; and
the output of the third rectangular wave signal,
at a given timing.

9. An electronic equipment including the integrated circuit device recited in claim 1.

10. A method for controlling an integrated circuit device, the method comprising:
a control signal outputting step of outputting a control signal;
a regulated voltage supplying step of supplying a regulated voltage;
a step of outputting an oscillation signal;
a step of outputting a first rectangular wave signal after an amplitude of the oscillation signal inputted is greater than a first amplitude; and
a step of outputting a second rectangular wave signal after the amplitude of the oscillation signal is greater than a second amplitude that is greater than the first amplitude,
wherein, in the control signal outputting step:
the control signal is outputted while the second rectangular wave signal is outputted, and the control signal lowers the regulated voltage; and
in the regulated voltage supplying step:
the regulated voltage is lowered after receiving the control signal to lower the regulated voltage.

* * * * *